United States Patent
Takahashi

(10) Patent No.: US 8,265,582 B2
(45) Date of Patent: Sep. 11, 2012

(54) SEMICONDUCTOR DEVICE

(75) Inventor: Tsuyoshi Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 449 days.

(21) Appl. No.: 12/648,162

(22) Filed: Dec. 28, 2009

(65) Prior Publication Data

US 2010/0248676 A1 Sep. 30, 2010

(30) Foreign Application Priority Data

Mar. 27, 2009 (JP) ................... 2009-78548
Aug. 17, 2009 (JP) ................... 2009-188320

(51) Int. Cl.
*H04B 1/06* (2006.01)
*H04B 7/00* (2006.01)

(52) U.S. Cl. ............ 455/252.1; 455/130; 455/341; 257/104; 257/189; 257/196; 257/197; 438/142; 438/143; 438/263; 716/137; 716/138

(58) Field of Classification Search ............ 455/130, 455/252.1, 341; 257/104, 189, 196–201, 257/348, 441, 443, 373, 30, 41–44; 438/142, 438/143, 263, 264; 716/137, 138

See application file for complete search history.

(56) References Cited

U.S. PATENT DOCUMENTS

| | | | |
|---|---|---|---|
| 6,064,074 A * | 5/2000 | Van Zutphen et al. ......... 257/10 |
| 6,635,907 B1 | 10/2003 | Nguyen et al. |
| 2004/0097035 A1 * | 5/2004 | Yamamukai ................. 438/257 |
| 2009/0014712 A1 * | 1/2009 | Suzuki ........................... 257/13 |

FOREIGN PATENT DOCUMENTS

| | | |
|---|---|---|
| JP | 2003-518326 A | 6/2003 |
| WO | 01/37348 A1 | 5/2001 |

* cited by examiner

*Primary Examiner* — Tuan Pham
(74) *Attorney, Agent, or Firm* — Westerman, Hattori, Daniels & Adrian, LLP

(57) ABSTRACT

A semiconductor device includes a p-type semiconductor layer and an n-type semiconductor layer that are joined by sandwiching a depletion layer with a thickness that allows transmission of a plurality of electrons and holes by direct-tunneling.

15 Claims, 33 Drawing Sheets

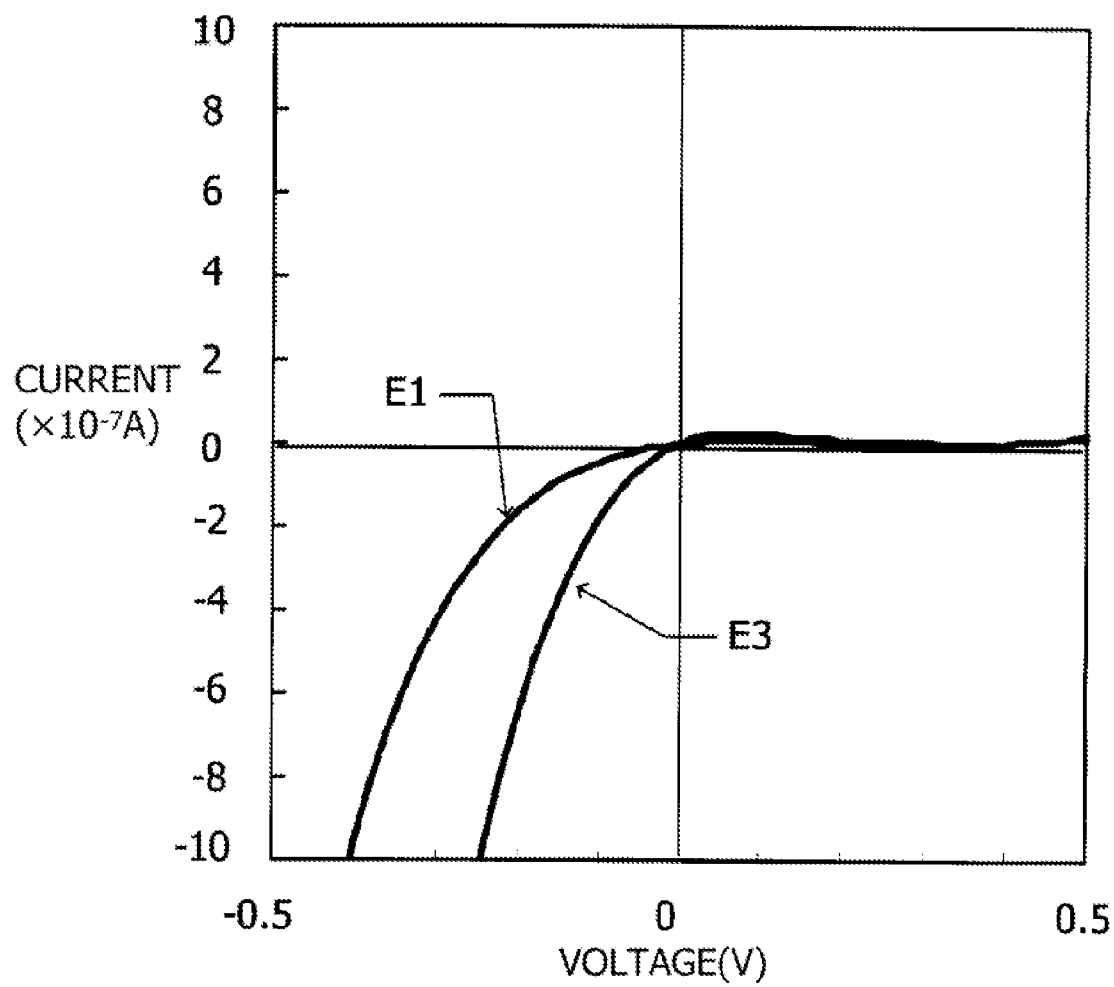

SEMICONDUCTOR DEVICE

CROSS-REFERENCE TO RELATED APPLICATIONS

This application is based upon and claims the benefit of priority of the prior Japanese Patent Application Nos. 2009-078548 and 2009-188320 filed on Mar. 27, 2009 and Aug. 17, 2009, respectively, the entire contents of which are incorporated herein by reference.

FIELD

The present disclosure relates to a semiconductor device, and in particular, relates to a semiconductor device that is suitable for detecting a weak high-frequency electrical signal.

BACKGROUND

A low noise amplifier and a detector are used together in order to detect a weak electrical wave in a millimeter wave field. For example, a Schottky diode is used for this detector.

FIG. 1A illustrates one example of current-voltage characteristics of a Schottky diode. The horizontal axis indicates a voltage, while the vertical axis indicates a current. The positive direction of the horizontal axis corresponds to a backward voltage. The dotted line 100 in FIG. 1A illustrates normal current-voltage characteristics. When a forward voltage exceeds an offset voltage Vos, the current abruptly rises. Thus, it is difficult to obtain sufficient detection characteristics in a range where an input voltage is equal to or lower than the offset voltage Vos.

The solid line 101 in FIG. 1 indicates current-voltage characteristics when a bias for correcting an offset Vos is applied. In this case, even if the applied forward voltage is infinitesimal, the current rises abruptly. However, a backward current Ir increases when the backward voltage is applied. Accordingly, the detection characteristics deteriorate.

FIG. 1B illustrates one example of current-voltage characteristics of an Esaki diode. The horizontal axis indicates a voltage, while the vertical axis indicates a current. The positive direction of the horizontal axis corresponds to a forward voltage. When a forward voltage is applied, electrons tunnel from a conduction band of an n-type layer to a valence band of a p-type layer. Moreover, when the forward voltage is further increased, electrons stop tunneling. This is because an energy level at a lower end of the valance band of the n-type layer is at a band gap of the p-type layer. As a result, a negative resistance appears.

Applying a backward voltage makes a current flow because electrons in the valence band of the p-type layer tunnel to the conduction band of the n-type layer. Thus, a backward current flows without exhibiting an offset voltage such as in a Schottky diode. Therefore, non-linear characteristics between the voltage and the current are obtained.

A peak current appears in a voltage range that is lower than a voltage in which a negative resistance appears under a forward bias. This peak current is observed as a backward leak current when an Esaki diode is used as a detector.

A backward diode is known that suppresses tunneling of electrons from a conduction band of an n-type layer to a valence band of a p-type layer under a forward bias. FIG. 1C illustrates one example of current-voltage characteristics of a backward diode. A current is lowered when a forward bias is applied compared with a current of an Esaki diode. Using a backward diode as a detector may better suppress a backward leak current compared with an Esaki diode.

Moreover, a backward diode that uses a p-type GaSb and an n-type InAs is known (for example, refer to Patent application publication No. 2003-518326).

FIG. 2 is an energy-band diagram of the backward diode. An AlSb layer with a thickness that allows tunneling of electrons is disposed between an n-type InAs layer and a p-type GaSb layer. Although, in actuality, energy band bending is caused near an interface between each layer, this is not illustrated in FIG. 2. A valence band of a p-type GaSb layer and a conduction band of an n-type InAs layer partially overlap at both sides of the AlSb layer.

When a positive voltage is applied to the n-type InAs layer, electrons in the valence band of the p-type GaSb layer are transported to the conduction band of the n-type InAs layer by tunneling, as indicated by the solid line arrow. An energy level of electrons at the lower end of the conduction band of the n-type InAs layer is within a band gap of the p-type GaSb layer under a state in which a given size of a positive voltage is applied to the p-type GaSb layer. Hence, the current does not flow.

The backward diode may obtain favorable detection characteristics by causing interband tunneling.

It is assumed that an infinitesimal positive voltage is applied to the p-type GaSb layer of the backward diode illustrated in FIG. 2. When an applied voltage is infinitesimal to the extent that the energy level of electrons at the lower end of the conduction band of an n-type InAs layer is in the valence band of the p-type GaSb layer, electrons in the conduction band of the n-type InAs layer are transported to the valence band of the p-type GaSb layer by tunneling as indicated by the dashed arrow in FIG. 2. Thus, sufficient detection characteristics may not be obtained in the infinitesimal voltage range.

SUMMARY

According to an aspect of the invention, a semiconductor device includes a p-type semiconductor layer and an n-type semiconductor layer that are joined by sandwiching a depletion layer with a thickness that allows transmission of a plurality of electrons and holes by direct tunneling, wherein a forbidden band of the n-type semiconductor layer and a forbidden band of the p-type semiconductor layer partially overlap under a state in which a flat band voltage that makes energy bands of the n-type semiconductor layer and the p-type semiconductor layer flat is applied between the n-type semiconductor layer and the p-type semiconductor layer; and an energy level of a plurality of electrons at an upper end of a valence band of the p-type semiconductor layer is equal to or higher than an energy level of a plurality of electrons at a lower end of a conduction band of the n-type semiconductor layer in a region that is further away from the depletion layer than a bending portion of an energy band which is contiguous with the depletion layer under an equilibrium state without any voltage being applied.

According to an another aspect of the invention, a semiconductor device includes a barrier layer with a thickness that allows transmission of a plurality of electrons by direct tunneling; and a p-type semiconductor layer and an n-type semiconductor layer that are disposed so as to sandwich the barrier layer, wherein a band gap of the barrier layer is wider than band gaps of the n-type semiconductor layer and the p-type semiconductor layer. An energy level of a plurality of holes at an upper end of a valence band of the barrier layer is higher than an energy level of a plurality of holes at an upper end of a valence band of the n-type semiconductor layer under a state in which a flat band voltage that makes energy bands of the n-type semiconductor layer and the p-type semiconductor layer flat is applied between the n-type semiconductor layer and the p-type semiconductor layer; and an energy level of a plurality of electrons at the upper end of the valence band of the p-type semiconductor layer is equal to or higher than an energy level of a plurality of electrons at the lower end of the conduction band of the n-type semiconductor layer in a region that is further away from a bending portion of an energy band at an interface between the barrier layer and the n-type semiconductor layer and an interface between the barrier layer and the p-type semiconductor layer under an equilibrium state without any voltage is applied.

According to an another aspect of the invention, a receiver comprising a detector and an amplifier that is coupled to the detector. The detector includes a p-type semiconductor layer and an n-type semiconductor layer that are joined by sandwiching a depletion layer with a thickness that allows transmission of a plurality of electrons and holes by direct tunneling, wherein a forbidden band of the n-type semiconductor layer and a forbidden band of the p-type semiconductor layer partially overlap under a state in which a flat band voltage that makes energy bands of the n-type semiconductor layer and the p-type semiconductor layer flat is applied between the n-type semiconductor layer and the p-type semiconductor layer; and an energy level of a plurality of electrons at an upper end of a valence band of the p-type semiconductor layer is equal to or higher than an energy level of a plurality of electrons at a lower end of a conduction band of the n-type semiconductor layer in a region that is further away from the depletion layer than a bending portion of the energy band which is contiguous with the depletion layer under an equilibrium state without any voltage is applied.

According to an another aspect of the invention, a receiver includes a detector, and an amplifier that is coupled to the detector. The detector includes a barrier layer with a thickness that allows transmission of a plurality of electrons by direct tunneling, and a p-type semiconductor layer and an n-type semiconductor layer that are disposed so as to sandwich the barrier layer, wherein a band gap of the barrier layer is wider than band gaps of the n-type semiconductor layer and the p-type semiconductor layer; an energy level of a plurality of holes at an upper end of a valence band of the barrier layer is higher than an energy level of a plurality of holes at an upper end of a valence band of the n-type semiconductor layer under a state in which a flat band voltage that makes energy bands of the n-type semiconductor layer and the p-type semiconductor layer flat is applied between the n-type semiconductor layer and the p-type semiconductor layer; and an energy level of a plurality of electrons at an upper end of a valence band of the p-type semiconductor layer is equal to or higher than an energy level of a plurality of electrons at a lower end of a conduction band of the n-type semiconductor layer in a region that is further away from an interface between the barrier layer and the n-type semiconductor layer, and an interface between the barrier layer and the p-type semiconductor layer than a bending portion of the energy band at the interfaces under an equilibrium state without any voltage being applied.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10A is a graph illustrating measurement results of current-voltage characteristics of the semiconductor devices according to the first embodiment and the third embodiment, and FIG. 10B is a diagram illustrating detection sensitivity;

DESCRIPTION OF EMBODIMENTS

First Embodiment

Figure 1A:
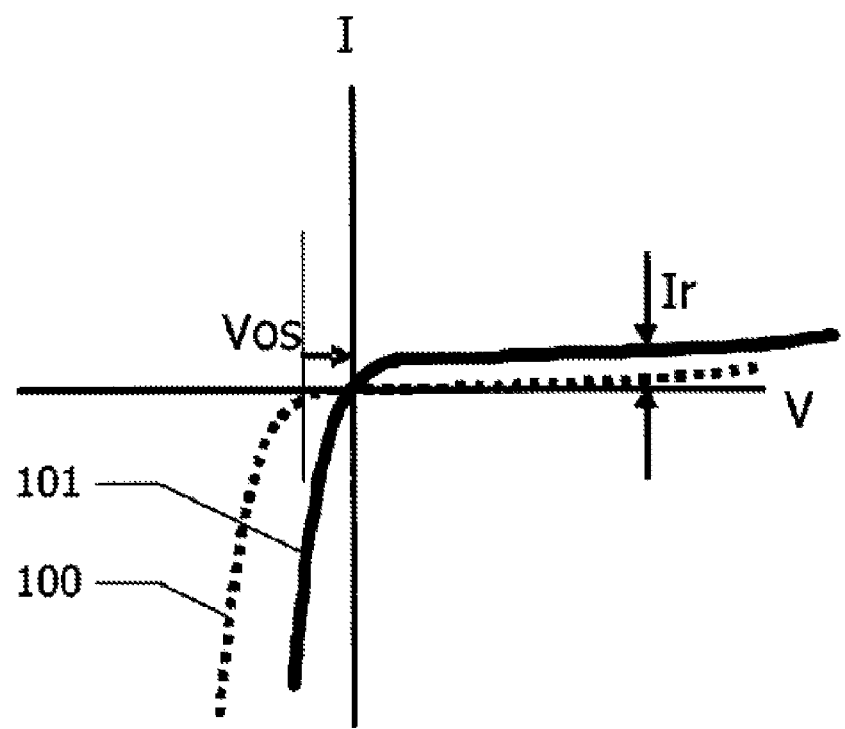
FIGS. 1A, 1B, and 1C are graphs illustrating current-voltage characteristics of Schottky diode, Esaki diode, and a backward diode of the related arts, respectively.
Figure 1B:
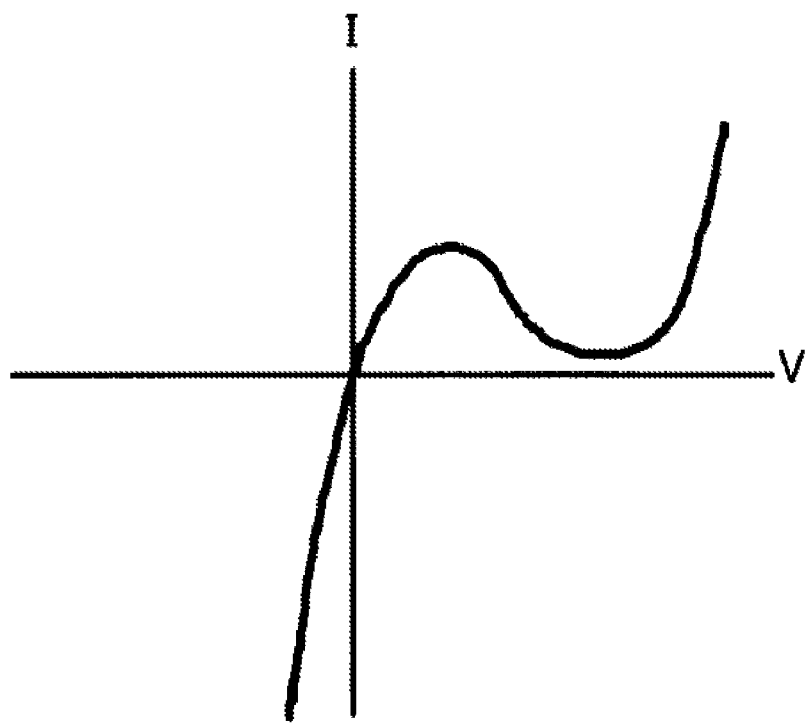
Figure 1C:
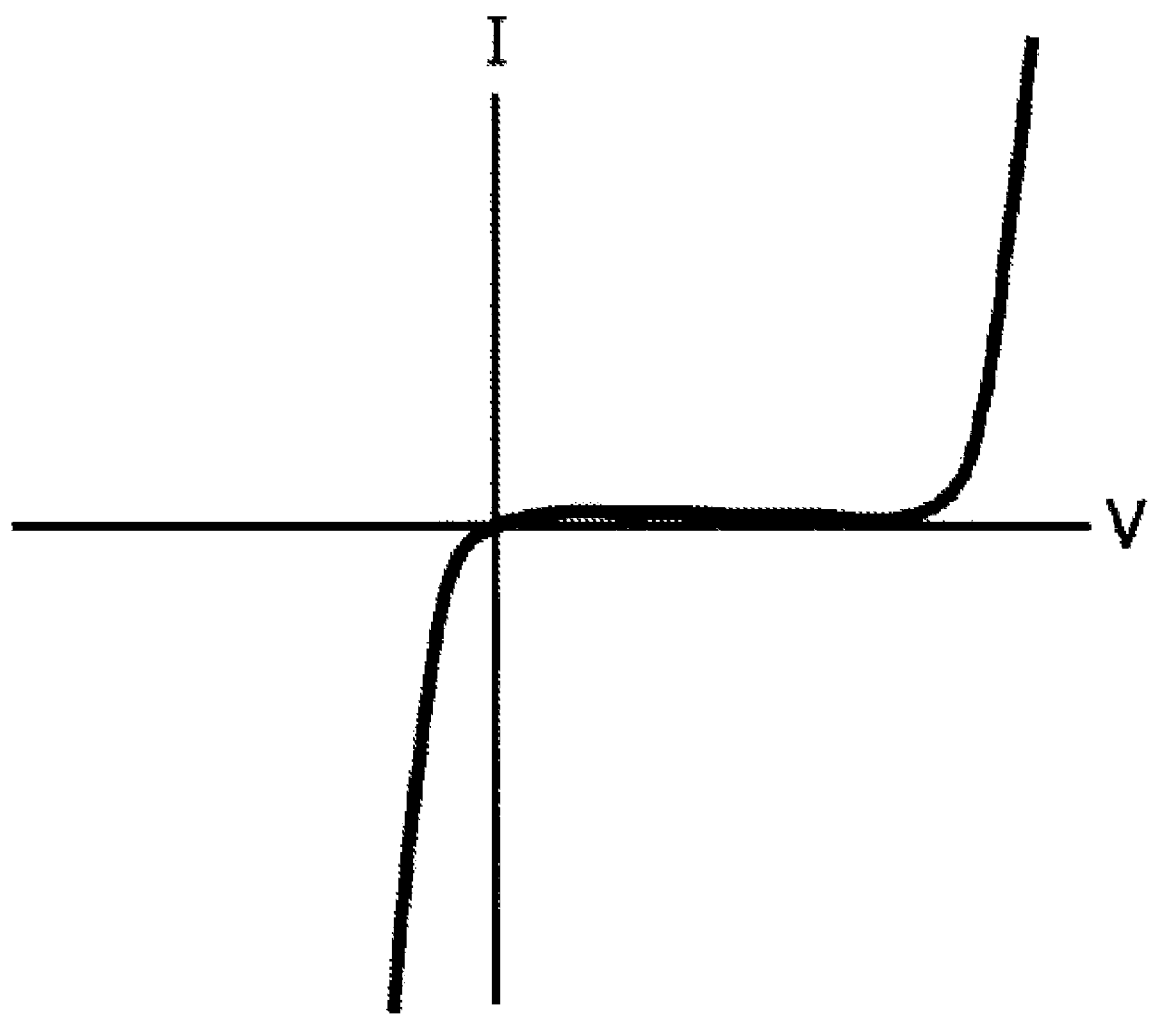
Figure 2:
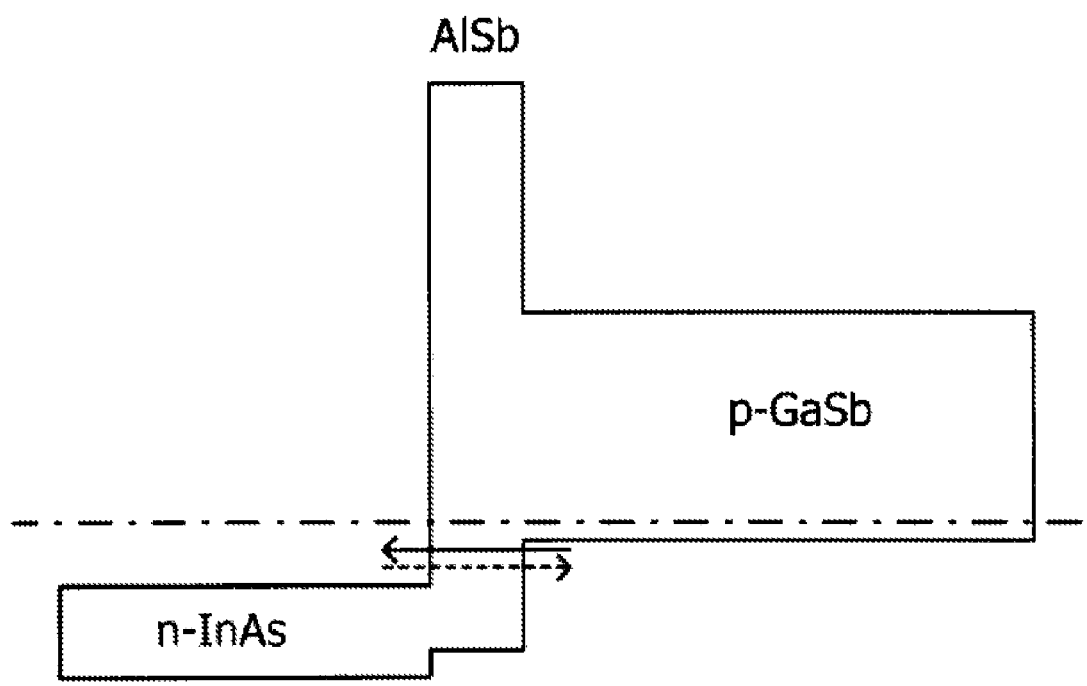
FIG. 2 is an energy band diagram of a backward diode using interband tunneling of a related art.
Figure 3A:
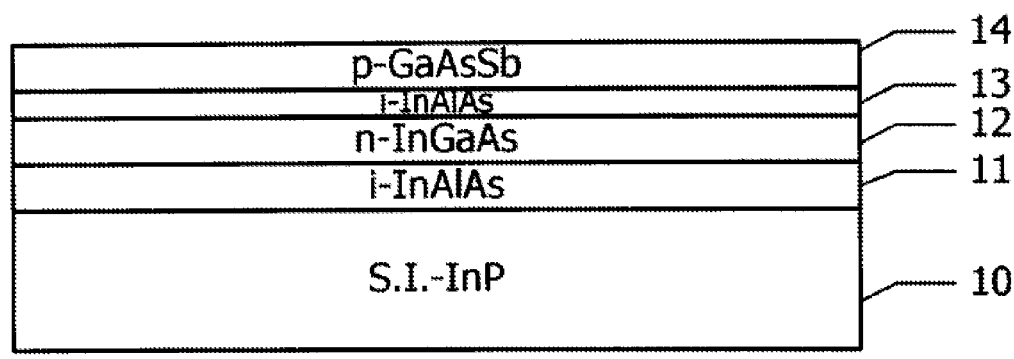
FIGS. 3A to 3D are sectional views of a manufacturing method of semiconductor device according to a first embodiment.

As illustrated in FIG. 3A, the following layers are formed over a semi-insulating InP semiconductor substrate 10: a buffer layer 11 of an intrinsic InAlAs (with a thickness of about 300 nm), an n-type semiconductor layer 12 of an n-type InGaAs (with a thickness of about 200 nm), a barrier layer 13 of an intrinsic InAlAs 13 (with a thickness of about 3 nm), and a p-type semiconductor layer 14 of a p-type GaAsSb (with a thickness of about 100 nm). Metal organic chemical vapor deposition (MOCVD) may be used for the formation of these layers. Elemental ratios of the layers are selected so as to substantially lattice-match with the semiconductor substrate 10 that is made up of InP.

The thickness of the barrier layer 13 is not limited to about 3 nm but may be any thickness as long as electrons may be passed by direct tunneling. For example, the thickness of the barrier layer 13 is preferably 10 nm or less. Moreover, considering stability of the film formation process, it is preferable that the thickness of the barrier layer 13 be 3 nm or more.

An impurity concentration of the n-type semiconductor layer 12 and that of the p-type semiconductor layer 14 may be, for example, about $1 \times 10^{19}$ cm$^{-3}$. In a semiconductor layer to which a large amount of impurities is doped, the Fermi level may be in the conduction band or in the valence band, or in the forbidden band of a lower bottom of the conduction band or an upper end of the valence band close to a pole.

Figure 3B:
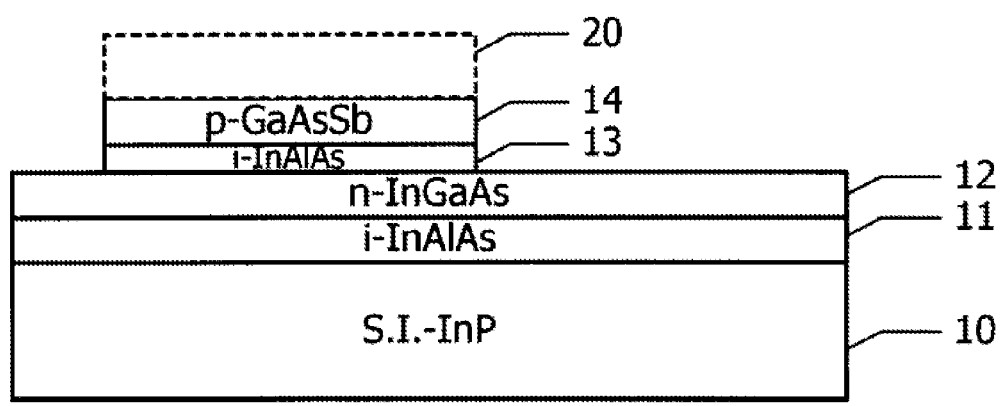

As illustrated in FIG. 3B, the p-type semiconductor layer 14 and the barrier layer 13 are etched using a resist pattern 20 as an etching mask. For example, a mixture liquid of phosphoric acid and hydrogen peroxide may be used for etching the p-type semiconductor layer 14 and the barrier layer 13. After etching the p-type semiconductor layer 14 and the barrier layer 13, the resist pattern 20 is removed. The barrier layer 13 and the p-type semiconductor layer 14 are kept over a part of the region of the n-type semiconductor layer 12.

Figure 3C:
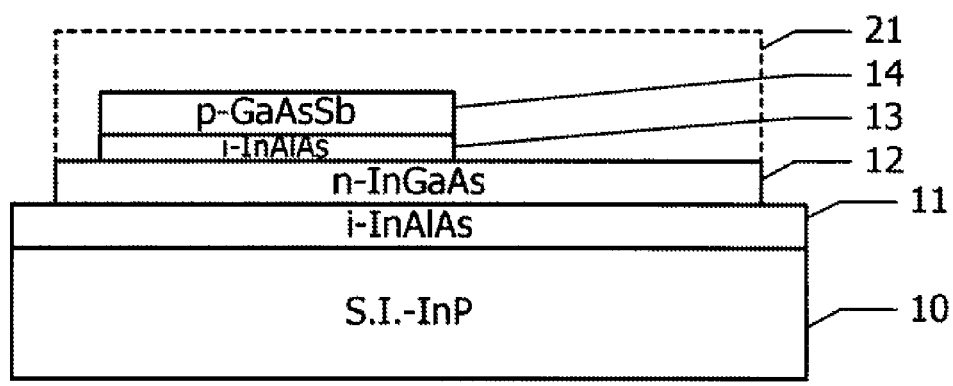

As illustrated in FIG. 3C, the n-type semiconductor layer 12 is etched using a resist pattern 21 as an etching mask. The resist pattern 21, in a planar view, covers the p-type semiconductor layer 14. For example, a mixture liquid of phosphoric acid and hydrogen peroxide may be used for etching the n-type semiconductor layer 12. After etching the n-type semiconductor layer 12, the resist pattern 21 is removed. The portion of the n-type semiconductor layer 12 that is covered by the resist pattern 21 is larger than the above p-type semiconductor layer 14.

Figure 3D:
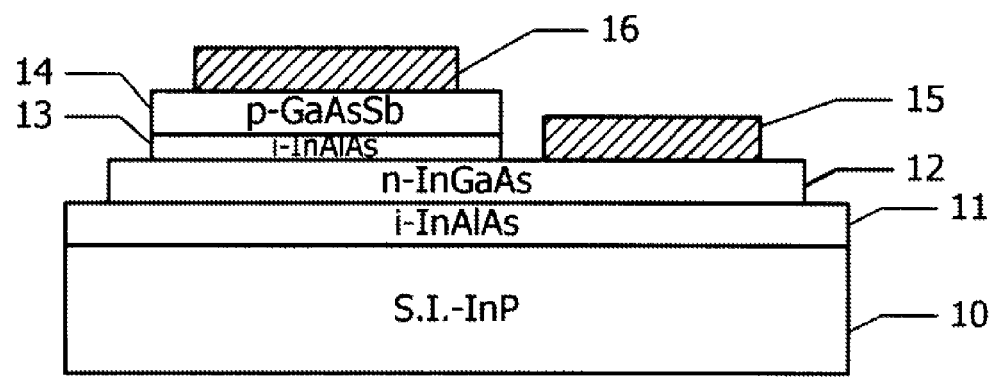

As illustrated in FIG. 3D, an n-side electrode 15 is formed over the extended portion of the n-type semiconductor layer 12, and a p-side electrode 16 is formed over the p-type semiconductor layer 14. The n-side electrode 15 and the p-side electrode 16 are made up of a laminated structure, for example, of a Ti film with a thickness of about 10 nm, and a Pt film with a thickness of about 30 nm, and an Au film with a thickness of about 300 nm. The n-side electrode 15 and the p-side electrode are formed, for example, by a vapor deposition method or a lift-off method. The n-side electrode 15 is in ohmic contact with the n-type semiconductor layer 12, while the p-side electrode 16 is in ohmic contact with the p-type semiconductor layer 14. Thus, a diode is obtained that is made up of a pair of terminals of the n-side electrode 15 and the p-side electrode 16.

Figure 4A:
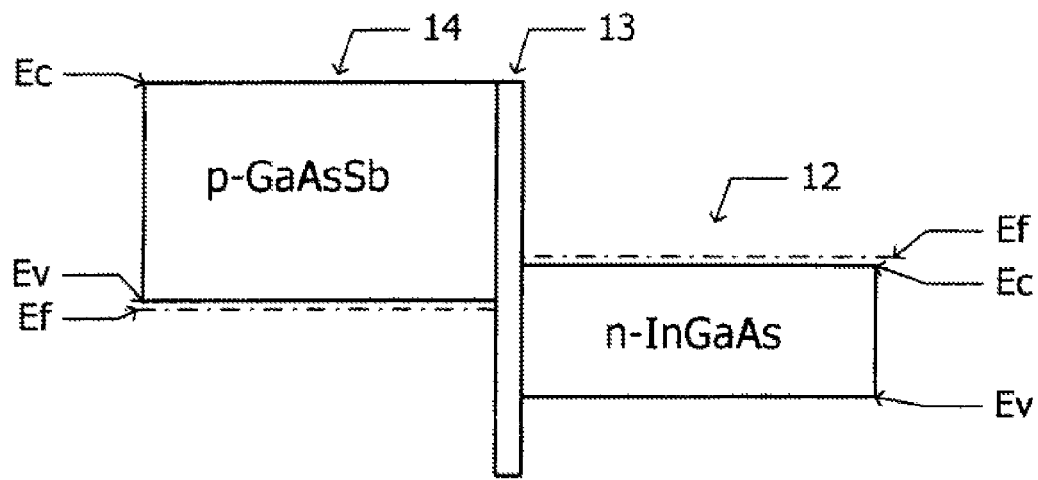
FIGS. 4A to 4E are energy band diagrams when various biases are applied to the semiconductor device according to the first embodiment.

FIG. 4A is an energy band diagram of the n-type semiconductor layer 12, the barrier layer 13, and the p-type semiconductor layer 14 of the semiconductor device according to the first embodiment under a flat band state. A flat band voltage is applied between the n-type semiconductor layer 12 and the p-type semiconductor layer 14, and the energy band bending is reduced to be approximately flat near the interface between the n-type semiconductor layer 12 and the barrier layer 13, and near the interface between the barrier layer 13 and the p-type semiconductor layer 14.

In the n-type semiconductor layer 12, a Fermi level Ef is in the conduction band. In the p-type semiconductor layer 14, the Fermi level Ef is in the valence band. In other words, the n-type semiconductor layer 12 and the p-type semiconductor layer 14 are degenerated.

The band gap width of the barrier layer 13 is wider than the band gap widths of the n-type semiconductor layer 12 and the p-type semiconductor layer 14. The lower end of the conduction band Ec of the n-type semiconductor layer 12 is lower than the lower end of the conduction band Ec of the p-type semiconductor layer 14, and the upper end of the valence band Ev of the n-type semiconductor layer 12 is lower than the upper end of the valence band Ev of the p-type semiconductor layer 14. Moreover, the forbidden band of the n-type semiconductor layer 12 partially overlaps with the forbidden band of the p-type semiconductor layer 14.

The barrier layer 13 disposed between the n-type semiconductor layer 12 and the p-type semiconductor layer 14 forms a depletion layer.

Figure 4B:
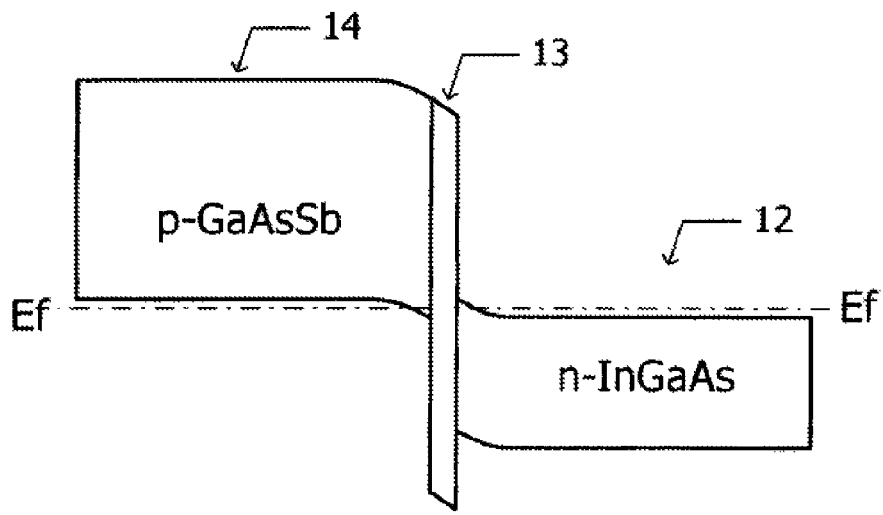

FIG. 4B illustrates an energy band diagram when no voltage is applied, in other words, under an equilibrium state. The Fermi level Ef in the n-type semiconductor layer 12 is substantially the same as the Fermi level Ef in the p-type semiconductor layer 14. The energy band of the n-type semiconductor layer 12 bends upward near the interface between the n-type semiconductor layer 12 and the barrier layer 13. The energy band of the p-type semiconductor layer 14 bends downward near the interface between the p-type semiconductor layer 14 and the barrier layer 13. The thickness of the region where the energy bands bend depends on the impurity concentration of the n-type semiconductor layer 12. As the impurity concentration increases, the region where the bends are caused becomes thinner.

The energy band becomes substantially flatter in a region away from the interfaces than the bending portion of the energy band at the interface between the n-type semiconductor layer 12 and the barrier layer 13 and the interface between the barrier layer 13 and the p-type semiconductor layer 14. The energy level of the upper end of the valence band of the p-type semiconductor layer 14 is substantially equal to or higher than the energy level of the lower end of the conduction band of the n-type semiconductor layer 12 in the region where the energy band is substantially flat.

The region in the n-type semiconductor layer 12 that is in contact with the barrier layer 13, the region in the p-type semiconductor layer that is in contact with the barrier layer 13, and the barrier layer 13 form a depletion layer. The thickness of the depletion layer allows transmission of electrons and holes by direct tunneling.

Figure 5:
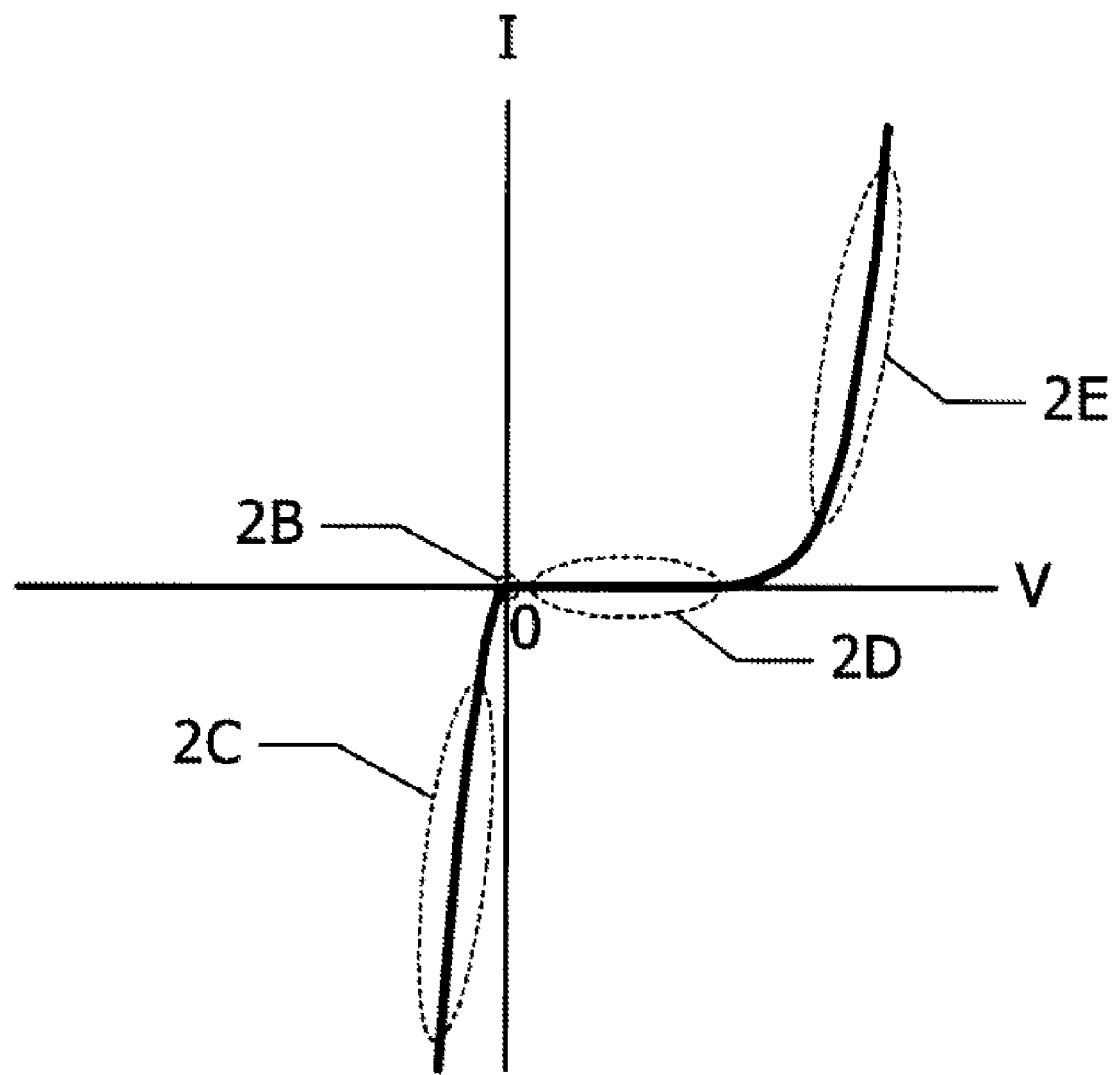
FIG. 5 is a graph illustrating current-voltage characteristics of the semiconductor device according to the first embodiment.

FIG. 5 illustrates current-voltage characteristics of the semiconductor device according to the first embodiment. The horizontal axis indicates voltage, while the vertical axis indicates current. The direction of the voltage that makes the potential of the p-type semiconductor layer 14 higher than that of the n-type semiconductor layer 12 is assumed to be positive (forward direction). The state in which no voltage is applied corresponds to the origin 2B in FIG. 5.

Figure 4C:
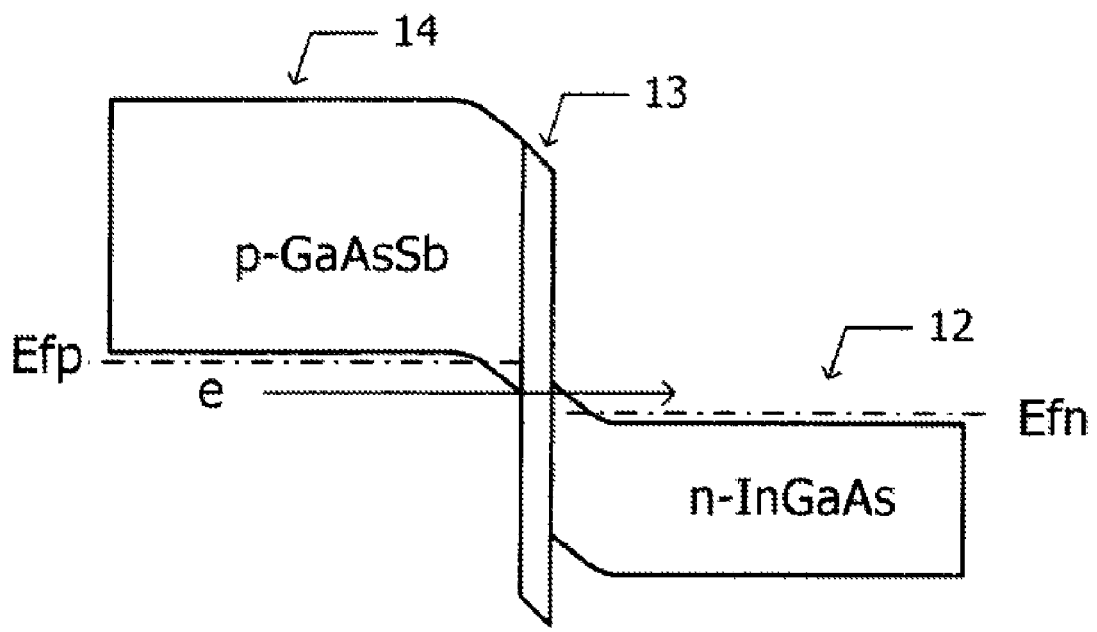
Figure 4D:
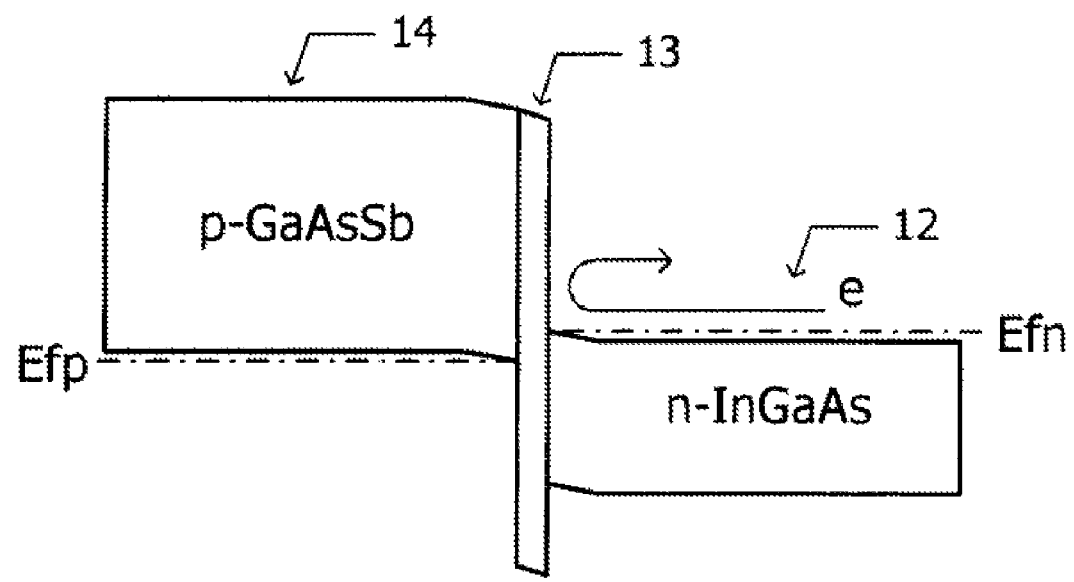
Figure 4E:
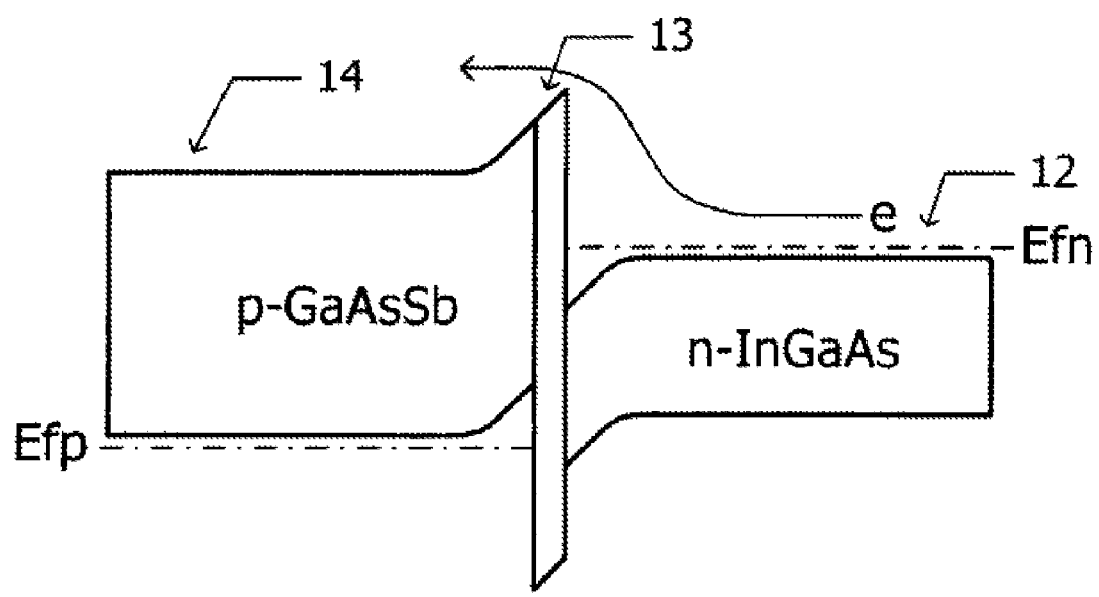

As illustrated in FIG. 4C, applying a backward voltage to the semiconductor device makes electrons in the valence band of the p-type semiconductor layer 14 move through a potential barrier at the barrier layer 13 and the bending portion of the energy band of the n-type semiconductor layer 12 by direct tunneling to the conduction band of the n-type semiconductor layer 12. Thus, the current abruptly rises as the backward voltage increases as illustrated in the graph area 2C in FIG. 5. In FIGS. 4C to 4E, the Efp and the Efn indicate pseudo-Fermi levels.

The bending portions of the energy band are thin when impurity concentrations of the n-type semiconductor layer 12 and the p-type semiconductor layer 14 are sufficiently high. Therefore, applying even an infinitesimal backward voltage makes a potential barrier thin enough to allow direct tunneling of electrons. The bending portion of the energy band becomes thick when impurity concentrations of the n-type semiconductor layer 12 and the p-type semiconductor layer 14 are not sufficiently high. Therefore, the potential barrier may not become thin enough when the backward voltage is infinitesimal, and a current may not rise by direct tunneling of electrons. It is preferable that the impurity concentrations of the n-type semiconductor layer 12 and the p-type semiconductor layer 14 are approximately $1\times10^{18}$ cm$^{-3}$ or more to make a current rise when the backward voltage is infinitesimal.

FIG. 4D is an energy band diagram when an infinitesimal forward voltage is applied to the semiconductor device. The bending portions of the energy band in the n-type semiconductor layer 12 and the p-type semiconductor layer 14 are reduced to approach a flat-band state. Under the near flat-band state, the energy level in the lower end of the conduction band of the n-type semiconductor layer 12 is within the forbidden band of the p-type semiconductor layer 14. Hence, electrons near the lower end of the conduction band of the n-type semiconductor layer 12 are not transported to the p-type semiconductor layer 14. This state corresponds to the area 2D where almost no current flows in the graph illustrated in FIG. 5. In other words, almost no current flows when a forward voltage is infinitesimal.

An energy level of holes at the upper end of the valence band of the barrier layer 13 is higher than the energy level of holes at the upper end of the valence band of the n-type semiconductor layer 12 and at the upper end of the valence band of the p-type semiconductor layer 14. Therefore, the barrier layer 13 forms a potential barrier for the holes under a forward bias state illustrated in FIG. 4D. As a result, a current caused by holes under the forward bias state is suppressed as well.

As illustrated in FIG. 4E, increasing a forward voltage allows electrons in the conduction band of the n-type semiconductor layer 12 to be transported to the conduction band of the p-type semiconductor layer 14 by passing the potential barrier of the barrier layer 13. This state corresponds to the current rising part 2E in the graph illustrated in FIG. 5.

As illustrated in FIG. 5, sufficient detection characteristics are obtained in the infinitesimal voltage range. As contrasted with general diodes, a current flows when a reverse bias is applied in an infinitesimal voltage range, whereas no current flows when a forward bias is applied in an infinitesimal voltage range.

A forward current flows by interband tunneling when an infinitesimal forward bias as illustrated in FIG. 4C is applied under a condition that an energy level of electrons at the lower end of the conduction band of the n-type semiconductor layer 12 is lower than the energy level of electrons at the upper end of the valence band of the p-type semiconductor layer 14 when a flat band voltage is applied. In the first embodiment, as illustrated in FIG. 4A, since the energy level of electrons in the lower end of the conduction band of the n-type semiconductor layer 12 is in the forbidden band of the p-type semiconductor layer 14 under a flat band state, a current may not flow by interband tunneling under a condition that an infinitesimal forward bias is applied. Accordingly, a leak current under a condition that a forward bias is applied may be suppressed.

According to the above described first embodiment, the n-type semiconductor layer 12, the barrier layer 13, and the p-type semiconductor layer 14 are substantially lattice-matched with the semiconductor substrate 10. However, the lattice-matching may not be needed. The thickness of each layer may be a critical film thickness or less when the lattice-matching is not employed.

According to the first embodiment, InGaAs is used for the n-type semiconductor layer 12, while GaAsSb is used for the p-type semiconductor layer 14. However, other semiconductor materials may be used as long as such materials satisfy the following conditions.

First, an energy level of electrons in the lower end of the conduction band of the n-type semiconductor layer 12 is lower than an energy level of the lower end of the conduction band of the p-type semiconductor layer 14.

Secondly, an energy level of the upper end of the valence band of the n-type semiconductor layer 12 is lower than an energy level of the upper end of the valence band of the p-type semiconductor layer 14.

Thirdly, a forbidden band of the n-type semiconductor layer 12 partially overlaps with a forbidden band of the p-type semiconductor layer 14 under a condition that a flat voltage is applied between the n-type semiconductor layer 12 and the p-type semiconductor layer 14.

Fourthly, an energy level of electrons at the upper end of the valence band of the p-type semiconductor layer 14 is equal to or higher than an energy level of the lower end of the conduction band of the n-type semiconductor layer 12 in a region further away from the interfaces than the bending portions of the energy band at the interface between the barrier layer 13 and the n-type semiconductor layer 12, and the interface between the barrier layer 13 and the p-type semiconductor layer 14, where the energy band is flat under an equilibrium state when no voltage is applied.

When materials that satisfy all of the above described conditions are used, applying a reverse bias between the n-type semiconductor layer 12 and the p-type semiconductor layer 14 makes electrons in the valence band of the p-type semiconductor layer 14 directly tunnel the barrier layer and be transported to the conduction band of the n-type semiconductor layer 12. No transportation of electrons by interband tunneling is caused when a forward voltage is applied.

Examples of III-V compound semiconductors used for the n-type semiconductor layer 12 may include In and As such as InAlGaAs, InGaAsP, and InAsP. Examples of III-V compound semiconductors used for the p-type semiconductor layer 14 may include As and Sb such as GaAlAsSb, and InGaAsSb.

Figure 6:
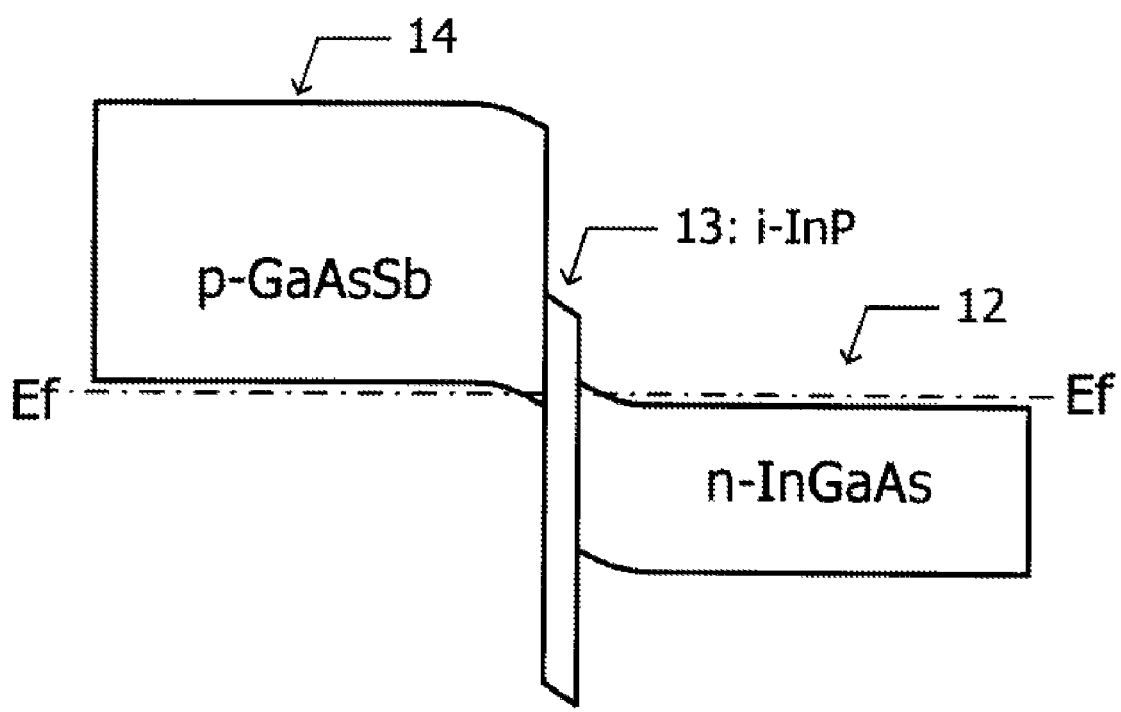
FIG. 6 is an energy band diagram of the semiconductor device of an alternative embodiment according to the first embodiment.

FIG. 6 is an energy band diagram of a semiconductor device according to an alternative embodiment according to the first embodiment. In this alternative embodiment, intrinsic InP is used instead of intrinsic InAlAs as a barrier layer 13. Using the intrinsic InP as the barrier layer 13 may raise a potential barrier against holes. Moreover, the intrinsic InP as the barrier layer 13 serves as an etching stopper layer when etching the p-type semiconductor layer 14 illustrated in FIG. 3B. Therefore, the alternative embodiment may reduce variations in the thicknesses of the n-type semiconductor layer 12 that is exposed after the etching.

When thicknesses of the n-type semiconductor layer 12 become substantially constant, variations in electrical resistance between the n-type semiconductor layer 12 that is immediately below the barrier layer 13 and the n-side electrode 15 may be reduced.

Second Embodiment

A manufacturing method of a semiconductor device according to a second embodiment will be described by referring to FIGS. 7A to 7E. The description below mainly discusses processes that are different from the manufacturing method according to the first embodiment, and the same configurations as in the first embodiment may not be described.

Figure 7A:
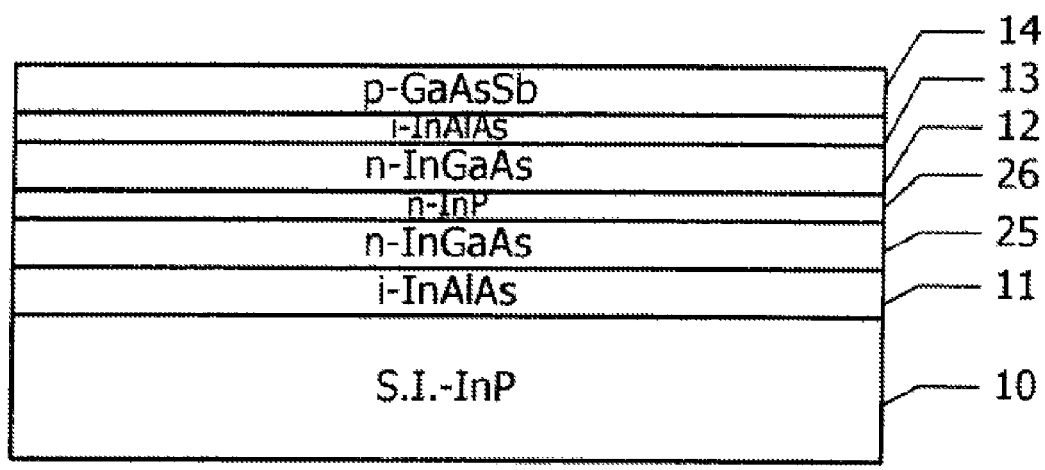
FIGS. 7A to 7E are sectional views illustrating a manufacturing method of a semiconductor device according to a second embodiment.

As illustrated in FIG. 7A, according to the second embodiment, an n-side ohmic contact layer 25 and an etching stopper layer 26 are disposed between a buffer layer 11 and an n-type semiconductor layer 12. The etching stopper layer 26 is disposed between the n-side ohmic contact layer 25 and the n-type semiconductor layer 12. The n-side ohmic contact layer 25 is formed of an n-type semiconductor that is made up of substantially the same composition as the n-type semiconductor layer 12. The etching stopper layer 26 is formed, for example, with an n-type semiconductor that includes In and P, for example, an n-type InP. The thickness of the etching stopper layer 26 is, for example, about 5 nm, and an n-type impurity concentration is about $5 \times 10^{18}$ cm$^{-3}$.

Figure 7B:
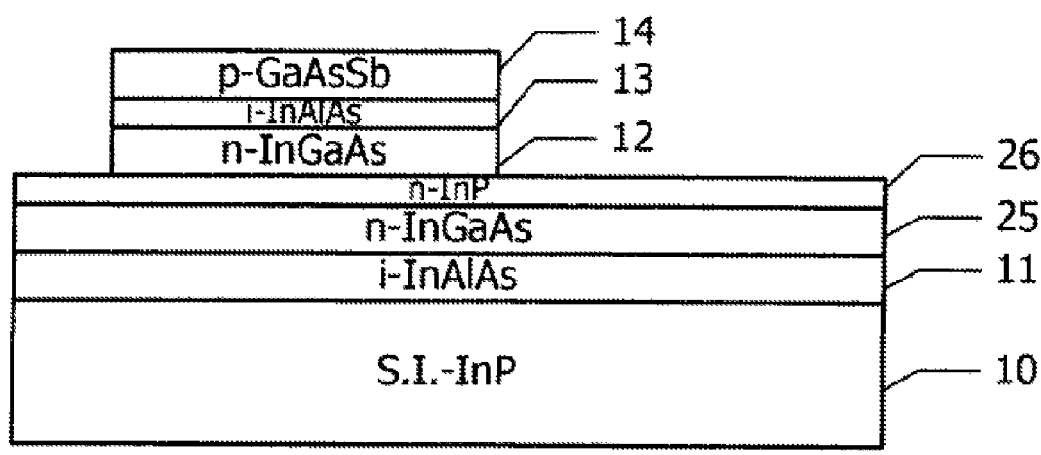

As illustrated in FIG. 7B, layers from a p-type semiconductor layer 14 to the n-type semiconductor layer 12 are patterned using, for example, a mixture liquid of phosphoric acid and hydrogen peroxide. Etching speed of a compound semiconductor that includes P as a V-group element is slow for this etchant. As a result, etching may be stopped with high repeatability upon exposure of the etching stopper layer 26.

Figure 7C:
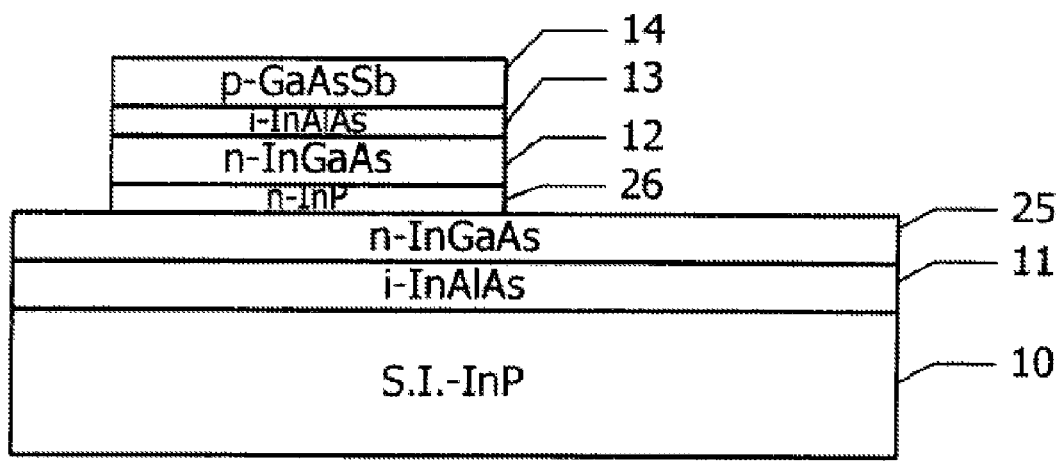

As illustrated in FIG. 7C, the exposed part of the etching stopper layer 26 is etched using, for example, a mixture liquid of hydrochloric acid and phosphoric acid. The etching may be stopped with high repeatability upon exposure of the n-side ohmic contact layer 25.

Figure 7D:
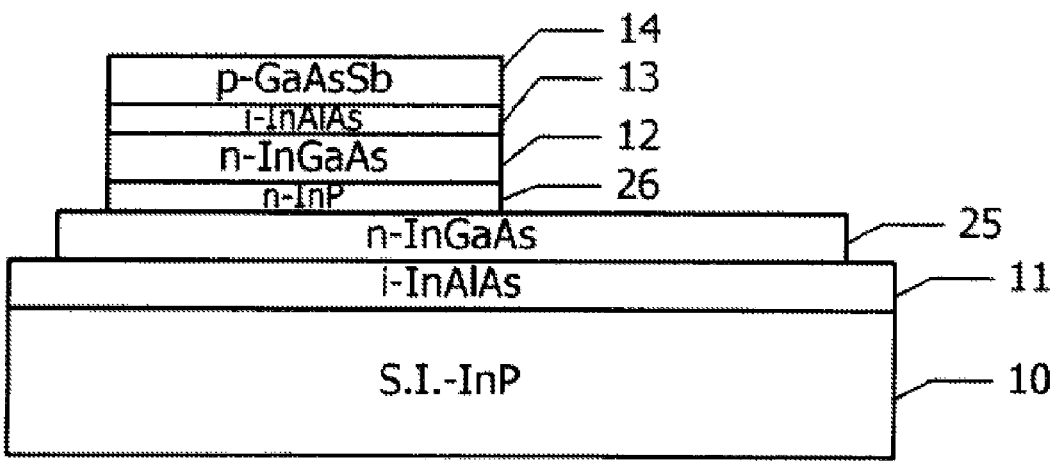

As illustrated in FIG. 7D, the n-side ohmic contact layer 25 is patterned. For example, this patterning is performed under substantially the same condition as the patterning of the n-type semiconductor layer 12 according to the first embodiment illustrated in FIG. 3C. The n-side ohmic contact layer 25, in a planar view, includes a region that is larger than a laminated structure from a p-type semiconductor layer 14 to the etching stopper layer 26.

Figure 7E:
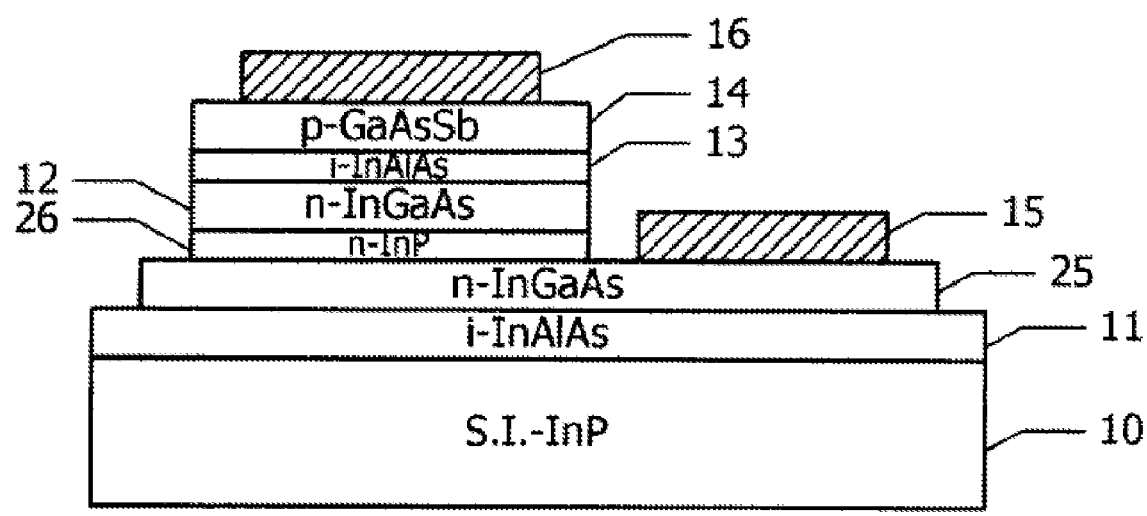

As illustrated in FIG. 7E, an n-side electrode 15 is formed over the extended region of the n-side ohmic contact layer 25 and a p-side electrode 16 is formed over the surface of the p-type semiconductor layer 14.

In the second embodiment, the process illustrated in FIG. 7B may stop etching at the etching stopper layer 26, and the process illustrated in FIG. 7C may stop etching at the n-side ohmic contact layer 25. Thus, a surface of the n-side ohmic contact layer 25 for allowing ohmic contact of the n-side electrode 15 may be exposed with high repeatability.

Variations in the thicknesses of the n-side ohmic contact layer 25 may be reduced. Thus, variations in electrical resistance in a region for projecting the electrode laterally may be reduced.

In the second embodiment, an n-type InP etching stopper layer 26 is interposed between the n-type InGaAs n-side ohmic contact layer 25 and the n-type semiconductor layer 12. Note that the etching stopper layer 26 may not influence current-voltage characteristics of the diode because the etching stopper layer 26 is sufficiently thin to allow direct tunneling of electrons, and is degenerated due to doping of a large amount of n-type impurities.

Third Embodiment

A manufacturing method of a semiconductor device according to a third embodiment will be described by referring to FIGS. 8A to 8C. The description below only discusses processes that are different from the manufacturing method according to the first embodiment, and configurations the same as those in the first embodiment may not be described.

Figure 8A:
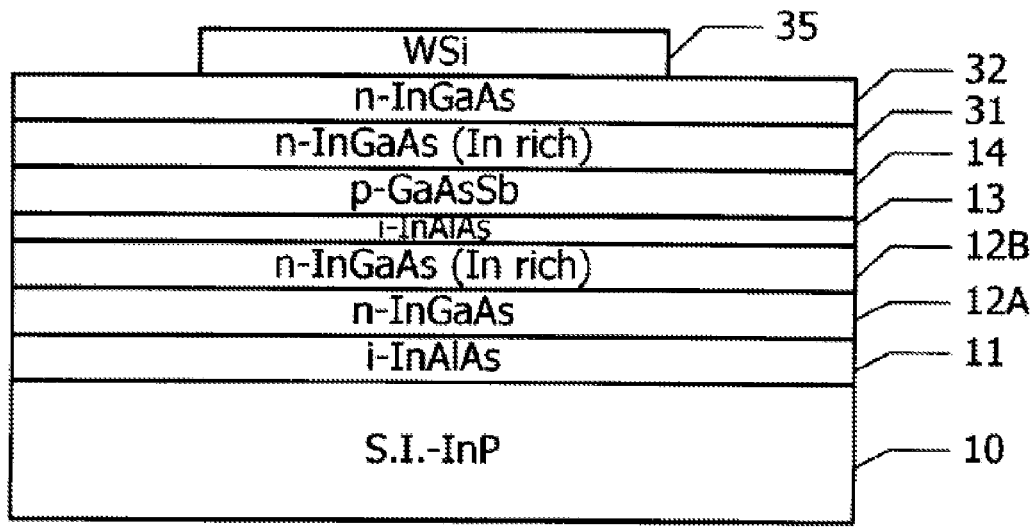
FIGS. 8A to 8C are sectional views illustrating a manufacturing method of the semiconductor device according to a third embodiment.

As illustrated in FIG. 8A, in the third embodiment, an n-type semiconductor layer 12 is divided into an In-poor composition layer 12A with a relatively low In composition ratio, and an In-rich composition layer 12B with a relatively high In composition ratio. The In-rich composition layer 12B is interposed between the In-poor composition layer 12A and a barrier layer 13.

The In-poor composition layer 12A has substantially the same composition ratio as the n-type semiconductor layer 12 of the semiconductor device according to the first embodiment, and is substantially lattice-matched with an InP semiconductor substrate 10. For example, the In composition ratio of the In-poor composition layer 12A may be 0.53, and that of the In-rich composition layer 12B is higher than 0.53, and may be 0.6. The thickness of the In-poor composition layer 12A may be, for example about 200 nm, while the thickness of the In-rich composition layer, for example, may be about 10 nm. N-type impurity concentrations of the In-poor composition layer 12A and the In-rich composition layer 12B are substantially the same as the n-type impurity concentration of the n-type semiconductor layer 12 according to the first embodiment.

A p-side ohmic coupling layer 31 and a p-side ohmic contact layer 32 are laminated over a p-type semiconductor layer 14. The p-side ohmic coupling layer 31 and the p-side ohmic contact layer 32 are formed with n-type compound semiconductors that includes In, Ga, and As, for example, an n-type InGaAs. The n-type impurity concentration is about $1 \times 10^{19}$ cm$^{-3}$.

The In composition ratio of the p-side ohmic coupling layer 31 is, for example, 0.8, which is higher than an InP lattice-matched composition ratio, and the thickness of the p-side ohmic coupling layer 31 is about 10 nm. The In composition ratio of the p-side ohmic contact layer 32 may be, for example, 0.53 and the thickness may be about 50 nm. In other words, the p-side ohmic contact layer 32 is substantially lattice-matched with the InP semiconductor substrate 10.

A WSi conductive layer 35 is formed over the p-side ohmic contact layer 32 by sputtering. The conductive layer 35 is patterned by dry etching using etching gas such as $CF_4$ or $SF_6$.

Figure 8B:
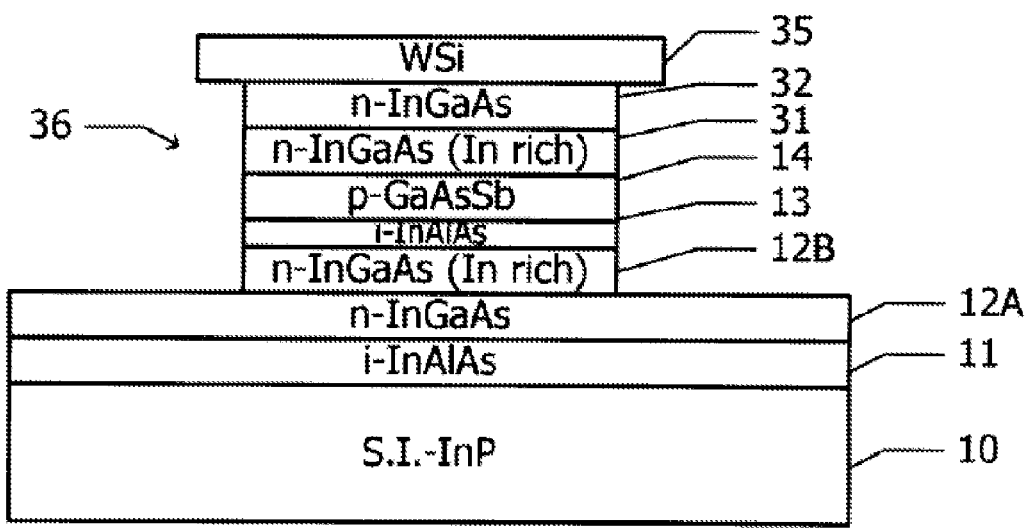

As illustrated in FIG. 8B, each layer from the p-side ohmic contact layer 32 to the bottom surface of the In-rich composition layer 12B is etched using the conductive layer 35 as an etching mask. For this etching, a wet etching, for example, using a mixture liquid of phosphoric acid and hydrogen peroxide may be employed. The surface of the In-poor composition layer 12A may be thinly etched. A mesa 36 is obtained that is made up of a laminated structure from the In-rich composition layer 12B to the p-side ohmic contact layer 32. The sides of the mesa 36 are side-etched, and an eave-like structure is obtained in which the edge of the conductive layer 35 protrudes from the sides of the mesa 36.

Figure 8C:
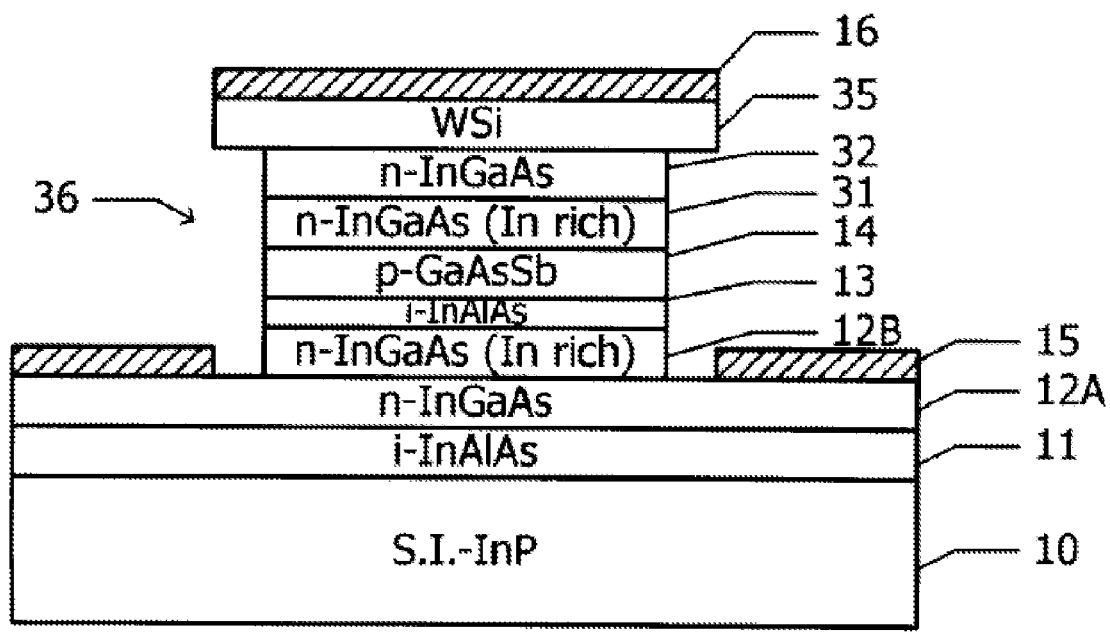

As illustrated in FIG. 8C, an n-side electrode 15 is formed over the surface of the In-poor composition layer 12A, and a p-side electrode 16 is formed over the surface of the conductive layer 35. For example, a vapor deposition method and a lift-off method may be applied to form these electrodes. The conductive layer 35 with an eave-like shape protruding from the sides of the mesa 36 serves as a mask during vapor deposition, thus the n-side electrode 15 may not be deposited directly under the conductive layer 35. Hence, the edge of the n-side electrode 15 that faces the mesa 36 is defined in a self-aligned manner. Accordingly, the n-side electrode 15 may be disposed close to the mesa 36. Thus, resistance elements from the In-rich composition layer 12B to the n-side electrode 15 may be reduced.

Figure 9:
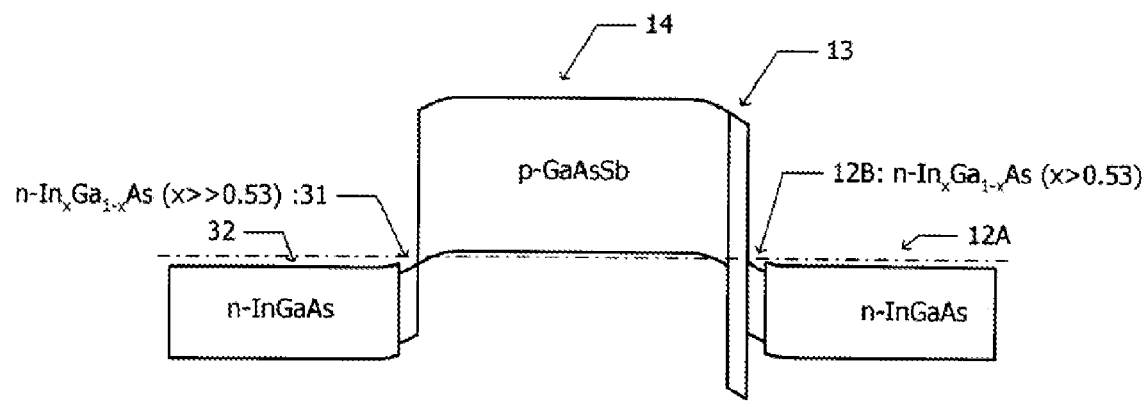
FIG. 9 is an energy band diagram of the semiconductor device according to the third embodiment.

FIG. 9 is an energy band diagram of a semiconductor device according to the third embodiment. The band gap width of the In-rich composition layer 12B is narrower than that of the In-poor composition layer 12A. Under a flat band state, an energy level of electrons in the lower end of the conduction band of the In-rich composition layer 12B is lower than an energy level of electrons in the lower end of the conduction band of the In-poor composition layer 12A. Comparison of FIG. 9 and FIG. 4B reveals that, in the semiconductor device according to the third embodiment, a potential barrier at the bending portion of the energy band of the n-type semiconductor layer 12 is lower than the potential barrier of the semiconductor device according to the first embodiment. Therefore, current flows easily by direct tunneling of electrons when a reverse bias is applied under the current-voltage characteristics illustrated in FIG. 3. As a result, detection characteristics may be further improved.

A p-side ohmic coupling layer 31 the band gap of which is narrower than the band gap of the p-side ohmic contact layer 32 is disposed between the p-type semiconductor layer 14 and the p-side ohmic contact layer 32. The p-side ohmic contact layer 31 reduces a potential barrier due to the bending of the energy band between the p-type semiconductor layer 14 and the p-side ohmic contact layer 32. When a reverse-bias voltage is applied to the n-type semiconductor layer 12 and the p-type semiconductor layer 14, transportation of electrons in the conduction band of the p-side ohmic contact layer 32 to the valence band of the p-type semiconductor layer 14 is caused. Hence, the p-type semiconductor layer 14 and the p-side ohmic contact layer 32 are coupled with low resistance.

FIG. 10A illustrates measurement results of current-voltage characteristics of the semiconductor device according to the third embodiment compared to measurement results of current-voltage characteristics of the semiconductor device according to the first embodiment. The horizontal axis in FIG. 10A indicates applied voltage in units of V, while the vertical axis indicates current in units of "$\times 10^{-7}$ A." The solid lines E3 and E1 in FIG. 10A indicates the current-voltage characteristics of the semiconductor device according to the third embodiment and the first embodiment respectively. Impurity concentration of the p-type semiconductor layer 14 is assumed to be $2\times 10^{19}$ cm$^{-3}$. Impurity concentrations of the In-poor composition layer 12A and the In-rich composition layer 12B are assumed to be $1\times 10^{19}$ cm$^{-3}$. The thickness of the In-rich composition layer 12B is assumed to be about 10 nm, and the In composition ratio is assumed to be 0.63.

Compared with the semiconductor device according to the first embodiment, the semiconductor device according to the third embodiment has a larger flow of current when a reverse bias is applied. Characteristics of both the semiconductor devices according to the first embodiment and the third embodiment are substantially the same when a forward bias is applied. This is because a potential barrier is low when a reverse bias is applied to the semiconductor device according to the third embodiment.

FIG. 10B illustrates measurement results of detection sensitivity when the semiconductor devices according to the third embodiment and the first embodiment are used as a detection circuit. When input power to the semiconductor device is set to −30 dBm, the voltage detected by the detection circuit using the semiconductor device of the first embodiment is about 1.85 mV and the sensitivity is about 1,850 V/W, whereas the voltage detected by the detection circuit using the semiconductor device of the third embodiment is about 2.50 mV and the sensitivity is about 2,500 V/W. As described the above, using the semiconductor device according to the third embodiment enables a higher detection sensitivity to be obtained.

Fourth Embodiment

A manufacturing method of a semiconductor device according to a fourth embodiment will be described by referring to FIGS. 11A to 11C. The description below mainly discusses processes that are different from the manufacturing method according to the third embodiment, and may not describe the same configurations.

Figure 11A:
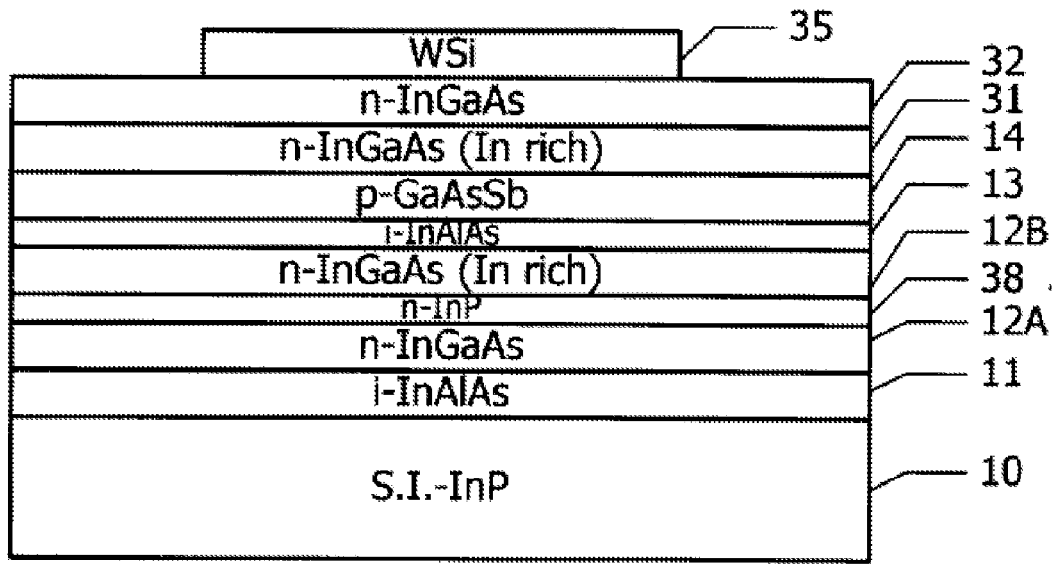
FIGS. 11A to 11C are sectional views illustrating a manufacturing method of the semiconductor device according to a fourth embodiment.

As illustrated in FIG. 11A, an etching stopper layer 38 that is made up of, for example, an n-type compound semiconductor that includes In and P such as an n-type InP is disposed between an In-poor composition layer 12A and an In-rich composition layer 12B. The thickness of the etching stopper layer 38 may be, for example about 5 nm, and the n-type impurity concentration is about $5\times 10^{18}$ cm$^{-3}$. Other parts of the laminated structure are substantially the same as the structure of the third embodiment illustrated in FIG. 8A.

Figure 11B:
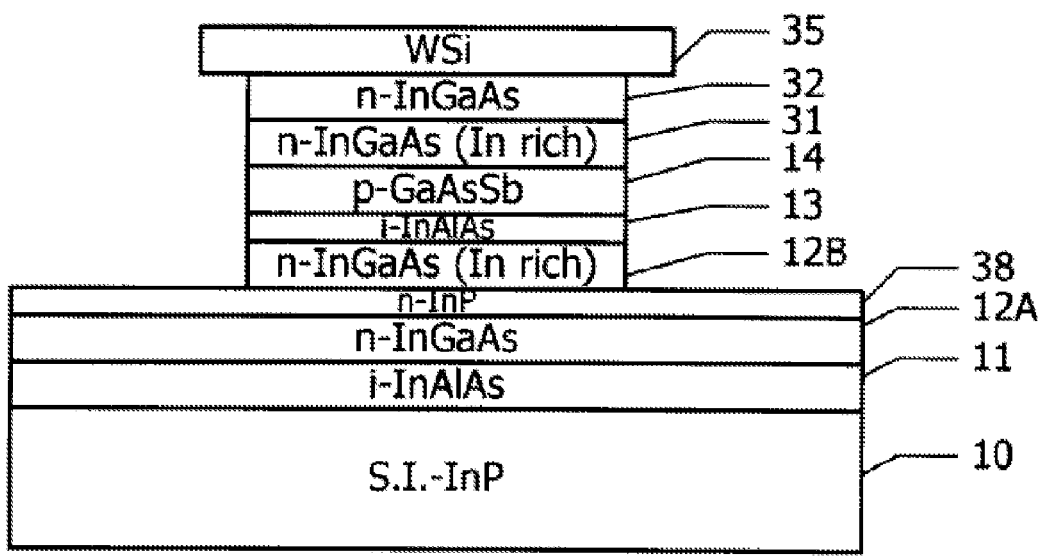

As illustrated in FIG. 11B, using a conductive film 35 as an etching mask, each layer from a p-side ohmic contact layer 32 to the bottom surface of the In-poor composition layer 12B is etched. The etching may be stopped with high repeatability upon exposure of the etching stopper layer 38.

Figure 11C:
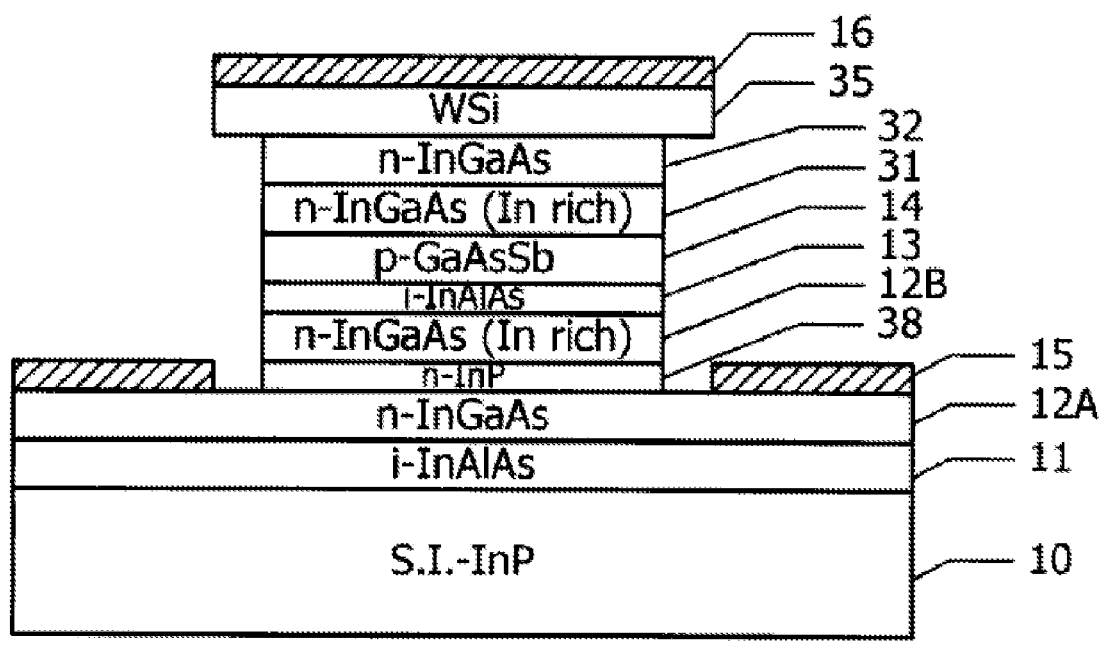

As illustrated in FIG. 11C, the exposed part of the etching stopper layer 38 is etched. The etching may be stopped with high repeatability upon exposure of the In-poor composition layer 12A. As in the third embodiment, an n-side electrode 15 and a p-side electrode 16 are formed.

According to the fourth embodiment, disposing the etching stopper layer 38 enables to easily control depth of the etching. Thus, yield loss due to excessive etching or insufficient etching may be suppressed.

The etching stopper layer 38 is sufficiently thin and the n-type impurity concentration is sufficiently high, thus, the current-voltage characteristics of the diode may not be influenced.

Figure 12:
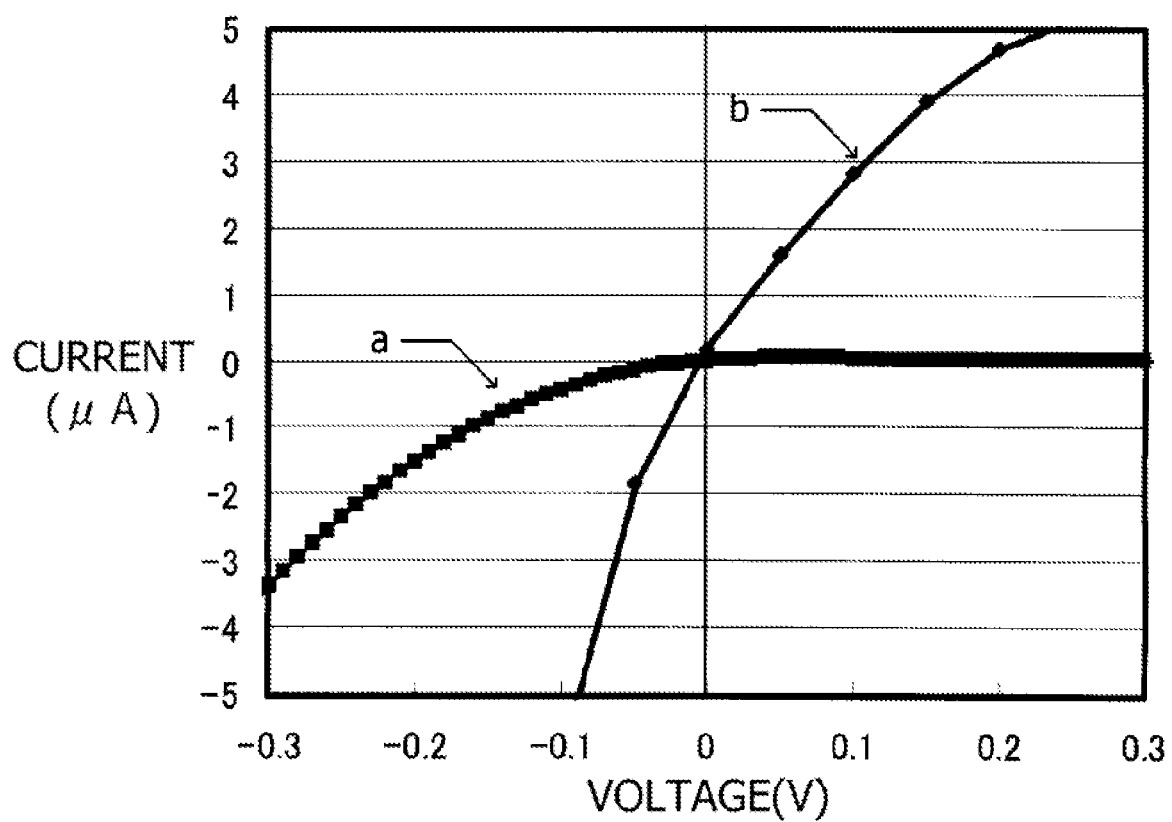
FIG. 12 is a graph illustrating measurement results of current-voltage characteristics of the semiconductor device according to the fourth embodiment.

FIG. 12 illustrates measurement results of current-voltage characteristics of the semiconductor device according to the fourth embodiment. The horizontal axis indicates a voltage in units of V, while the vertical axis indicates a current in units of μA. The line "a" in FIG. 12 illustrates the current-voltage characteristics of the semiconductor device according to the fourth embodiment. For comparison, the line "b" indicates current-voltage characteristics of a Schottky diode.

The Schottky diode does not exhibit substantial non-linearity where amplitude of a signal voltage is 0.3 V or less. On the other hand, the semiconductor device according to the fourth embodiment exhibits substantial non-linearity characteristics even when amplitude of a signal voltage is infinitesimal, 0.3 V or less. Accordingly, efficient detection may be achieved even with an infinitesimal signal voltage.

Figure 13:
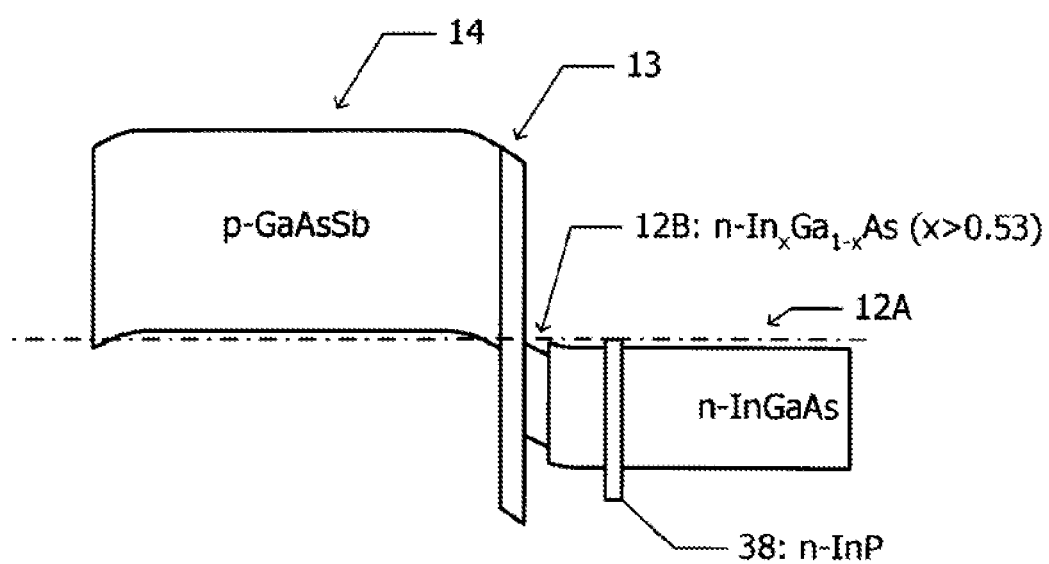
FIG. 13 is an energy band diagram of a semiconductor device according to the fourth embodiment.

FIG. 13 illustrates an energy band diagram of a semiconductor device according to an alternative embodiment of the fourth embodiment. In the fourth embodiment, the etching stopper layer 38 is disposed between the In-poor composition layer 12A and the In-rich composition layer 12B. According to the alternative embodiment, an etching stopper layer 38 is disposed in the In-poor composition layer 12A. In this manner, the etching stopper layer 38 may be disposed in the In-poor composition layer 12A.

Fifth Embodiment

A manufacturing method of a semiconductor device according to a fifth embodiment will be described by referring to FIGS. 14A to 14H. According to the fifth embodiment, a high electron mobility transistors (HEMT) for signal amplification, and a diode for detection are monolithically formed over a single semiconductor substrate.

Figure 14A:
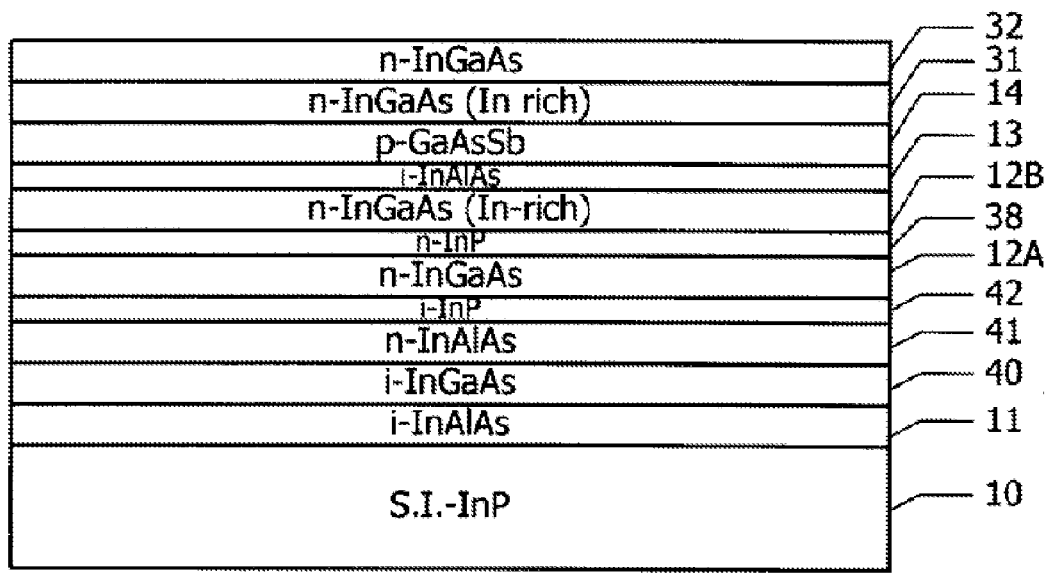
FIGS. 14A to 14H are sectional views illustrating a manufacturing method of a semiconductor device according to a fifth embodiment.

As illustrated in FIG. 14A, a channel layer 40, a supply layer 41, and an etching stopper layer 42 are interposed between a laminated structure of the buffer layer 11 and the In-poor composition layer 12A according to the fourth embodiment illustrated in FIG. 11A. However, the fifth embodiment does not include a conductive layer 35 as illustrated in FIG. 11A. The channel layer 40 is formed of intrinsic InGaAs, for example, with a thickness of about 15 nm. The supply layer 41 is formed of intrinsic InAlAs, for example, with a thickness of about 8 nm. The etching stopper layer 42 is formed of intrinsic InP, for example, with a thickness of about 5 nm.

Figure 14B:
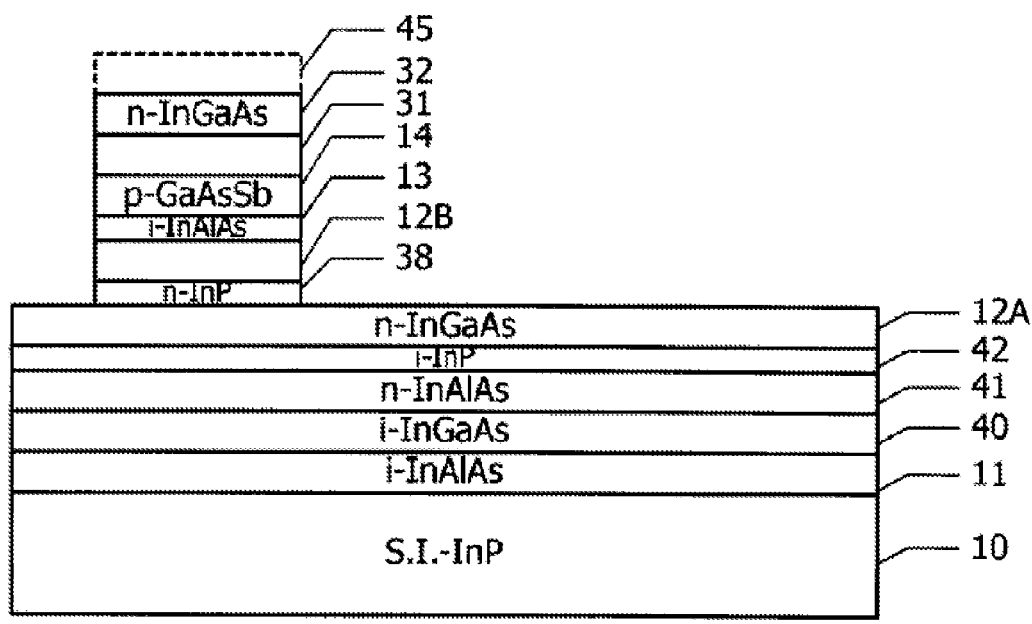

As illustrated in FIG. 14B, each layer from a p-side ohmic contact layer 32 to the upper surface of an etching stopper layer 38 is etched using a resist pattern 45 as an etching mask. For example, a mixture liquid of phosphoric acid and hydrogen peroxide may be used for this etching. The exposed part of the etching stopper layer 38 is etched using, for example, a mixture liquid of hydrochloric acid and phosphoric acid. After etching the etching stopper layer 38, the resist pattern 45 is removed.

Figure 14C:
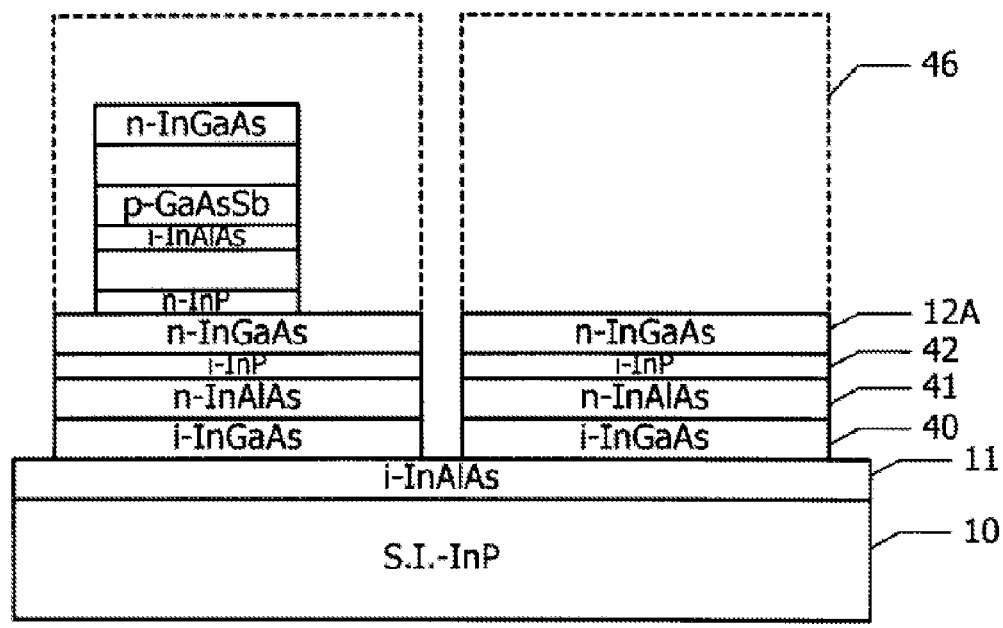

As illustrated in FIG. 14C, the diode region and the HEMT region are covered with a resist pattern 46. Each layer from the In-poor composition layer 12A to the bottom surface of the channel layer 40 is etched using the resist pattern 46 as an etching mask. For example, a mixture liquid of phosphoric acid and hydrogen peroxide may be used for the etching. This etching allows for element isolation of the diode and the HEMT. After the etching, the resist pattern 46 is removed.

Figure 14D:
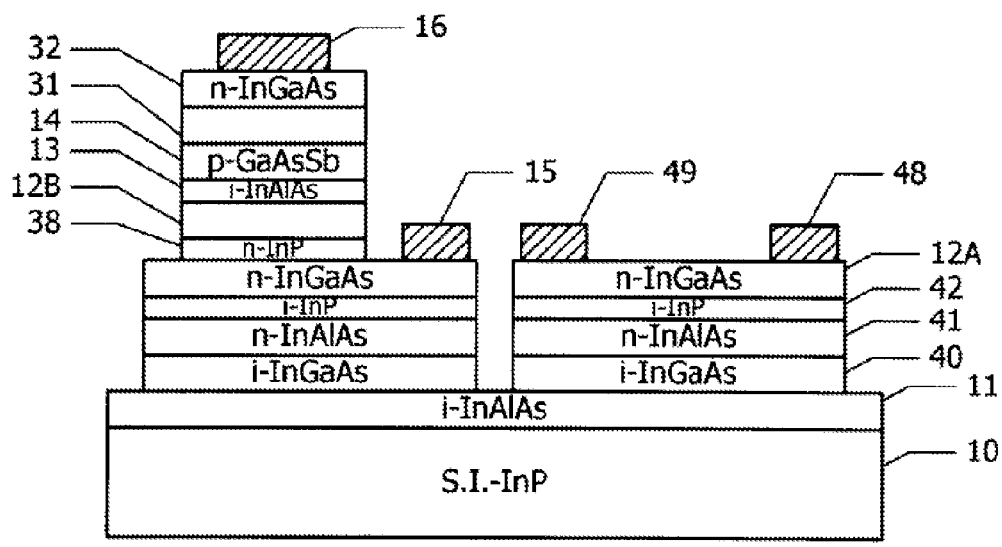

As illustrated in FIG. 14D, an n-side electrode 15 and a p-side electrode 16 are formed over a diode, and a drain electrode 48 and a source electrode 49 are formed over the In-poor composition layer 12A of the HEMT with a certain distance between the two electrodes. The drain electrode 48 and the source electrode 49 are in ohmic contact with the channel layer 40. The electrodes 48 and 49 are made up of a laminated structure in which a Ti film with a thickness of about 10 nm, a Pt film with a thickness of about 30 nm, and an Au film with a thickness of about 300 nm are laminated. For example, a vapor deposition method and a lift-off method is applied to form these electrodes.

Figure 14E:
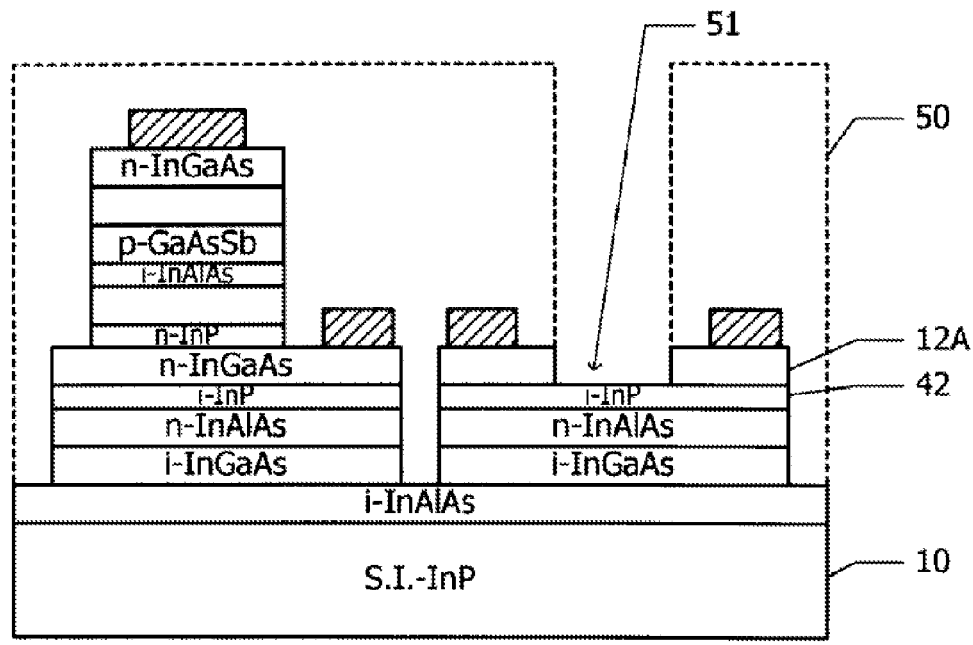

As illustrated in FIG. 14E, a resist pattern 50 with an opening for a recessed portion of the HEMT is formed by electron beam lithography. A recess 51 is formed by etching the In-poor composition layer 12A using the resist pattern 50 as an etching mask. For this etching, a wet etching, for example, using a mixture liquid of citric acid and hydrogen peroxide may be employed. The etching stopper layer 42 is exposed at the bottom surface of the recess 51. After forming the recess 51, the resist pattern 50 is removed.

Figure 14F:
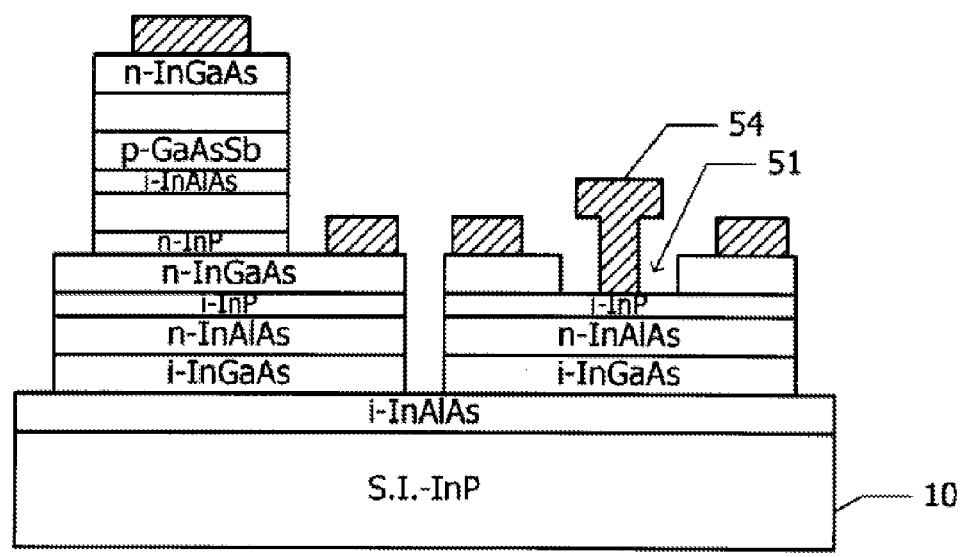

As illustrated in FIG. 14F, a Schottky gate electrode 54 is formed over the bottom surface of the recess 51. The Schottky electrode 54 is made up of a laminated structure in which a Ti film with a thickness of about 10 nm, a Pt film with a thickness of about 30 nm, and an Au film with a thickness of about 500 nm are laminated. For example, a vapor deposition method and a lift-off method is applied to form the Schottky gate electrode 54.

Figure 14G:
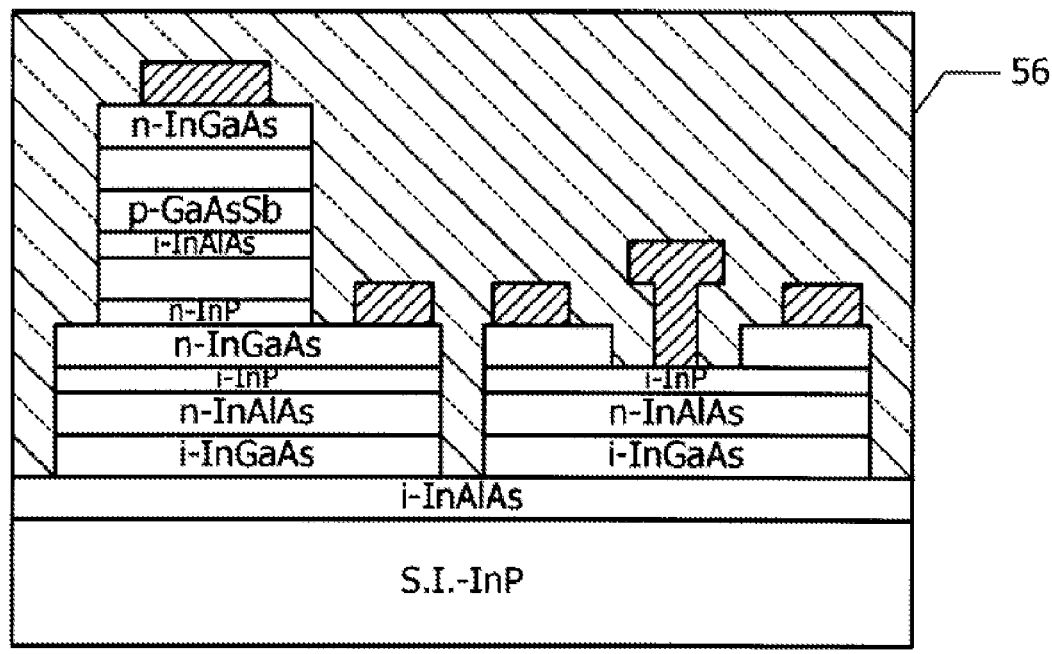

As illustrated in FIG. 14G, an interlayer dielectric film 56 that is made up of, for example, benzocyclobutene (BCB), is formed over the semiconductor substrate 10. The interlayer dielectric film 56 covers the diode and the HEMT.

Figure 14H:
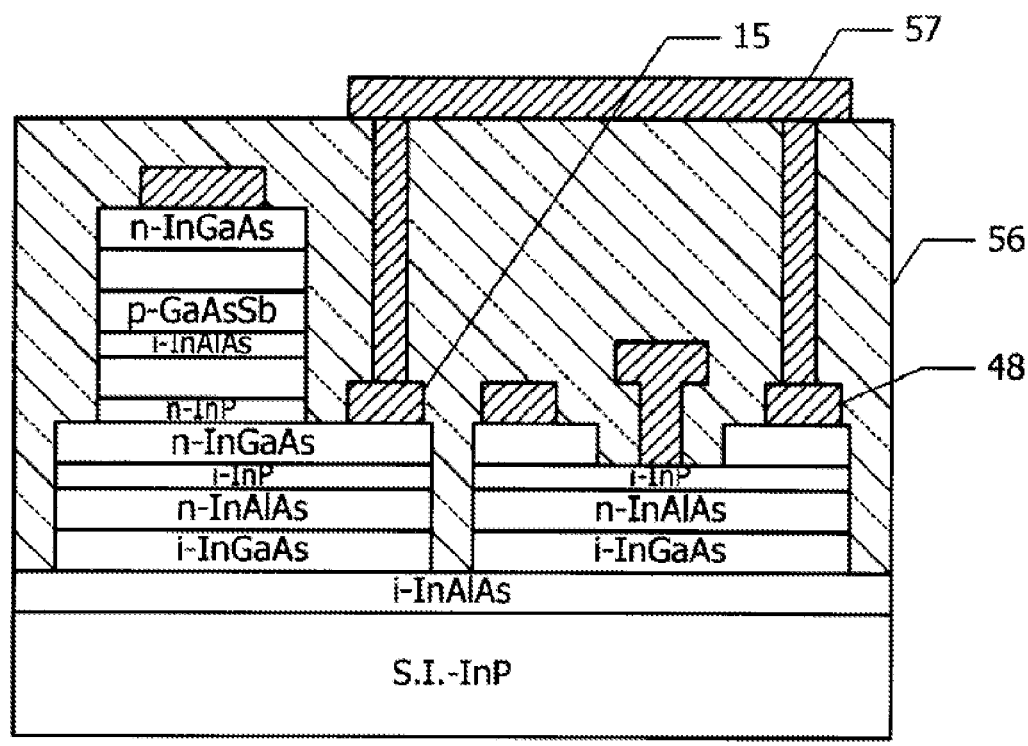

As illustrated in FIG. 14H, via holes are formed in the interlayer dielectric film 56 to form a wiring 57 between the elements. The wiring 57 couples the drain electrode 48 of the HEMT and the n-side electrode 15 of the diode to each other. Processes up to here form a monolithic microwave integrated circuit (MMIC) in which the HEMT as an amplifier element and the diode as a detection element are integrated.

Figure 15:
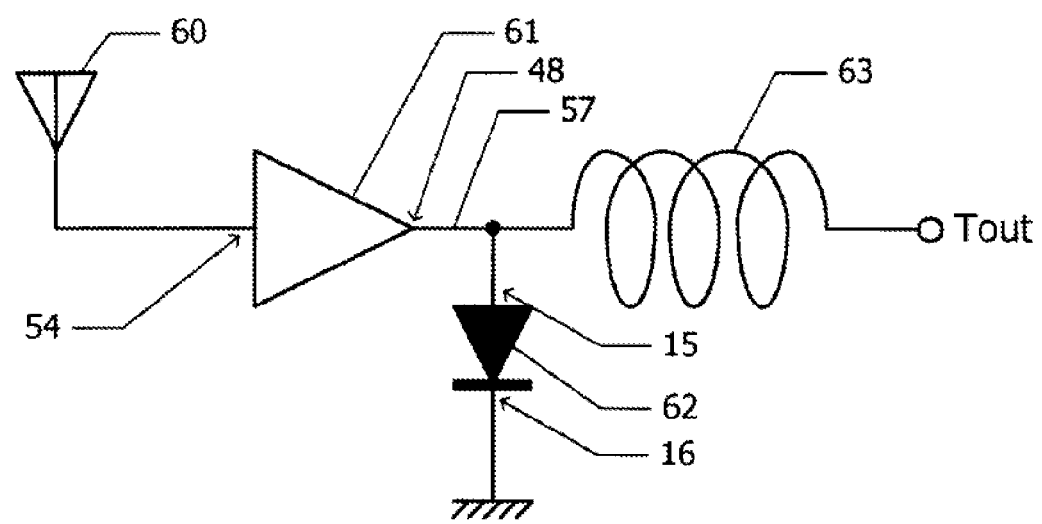
FIG. 15 is an equivalent circuit diagram of a receiver using the semiconductor device according to the fifth embodiment.

FIG. 15 illustrates an equivalent circuit diagram of a receiver using a semiconductor device according to the fifth embodiment. An amplifier element 61 corresponds to the HEMT of the semiconductor device according to the fifth embodiment. A detection element 62 corresponds to the diode of the semiconductor device according to the fifth embodiment. An antenna 60 is coupled to an input terminal of an amplifier element 61 that is the Schottky electrode 54 of the HEMT. An output terminal of the amplifier element 61 that is the drain electrode 48 is coupled to the n-side electrode 15 of the detection element by the wiring 57. The p-side electrode 16 of the detection element is grounded. Moreover, the output terminal of the amplifier element 61 is coupled to an output terminal Tout of the detection circuit through an inductor 63.

The diode in the semiconductor device according to the fifth embodiment is made up of substantially the same laminated structure as the semiconductor device according to the fourth embodiment illustrated in FIG. 11C. Thus, favorable detection characteristics may be obtained in a region where an input signal is infinitesimal.

Sixth Embodiment

Figure 16A:
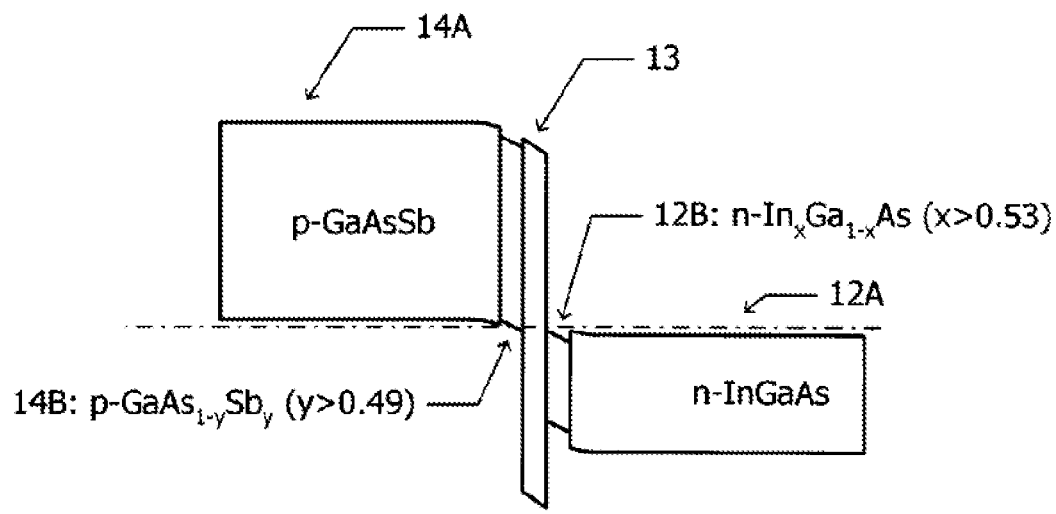
FIG. 16A is an energy band diagram of a semiconductor device according to the sixth embodiment.

FIG. 16A is an energy band diagram of a semiconductor device according to a sixth embodiment. Hereunder, differences from the energy band of the semiconductor device according to the third embodiment will be described. In the third embodiment, only the n-type semiconductor layer 12 is divided into two layers that are the In-poor composition layer 12A and the In-rich composition layer 12B; and the In-rich composition layer 12B, the band gap of which is smaller than that of the In-poor composition layer 12A, is interposed between the In-poor composition layer 12A and the barrier layer 13. According to the sixth embodiment, the p-type semiconductor layer 14 is also divided into a Sb-poor composition layer 14A and a Sb-rich composition layer 14B. The Sb-rich composition layer 14B the band gap of which is smaller than the Sb-poor composition layer 14A is interposed between the Sb-poor composition layer 14A and the barrier layer 13. The In-rich composition layer 12B and the Sb-rich composition layer 14b are in contact with the barrier layer 13.

The In composition ratio of the In-poor composition layer 12A is 0.53, the thickness is about 50 nm, and the n-type impurity concentration is about $5 \times 10^{18}$ cm$^{-3}$. The In composition ratio of the In-rich composition layer 12B is 0.7, the thickness is about 10 nm, and the n-type impurity concentration is about $5 \times 10^{18}$ cm$^{-3}$. The Sb composition ratio of the Sb-poor composition layer 14A is 0.49, the thickness is about 100 nm, and the p-type impurity concentration is about $1 \times 10^{19}$ cm$^{-3}$. The Sb composition ratio of the Sb-rich composition layer 14B is 0.6, the thickness is about 10 nm, and the p-type impurity concentration is about $2 \times 10^{19}$ cm$^{-3}$.

Figure 16B:
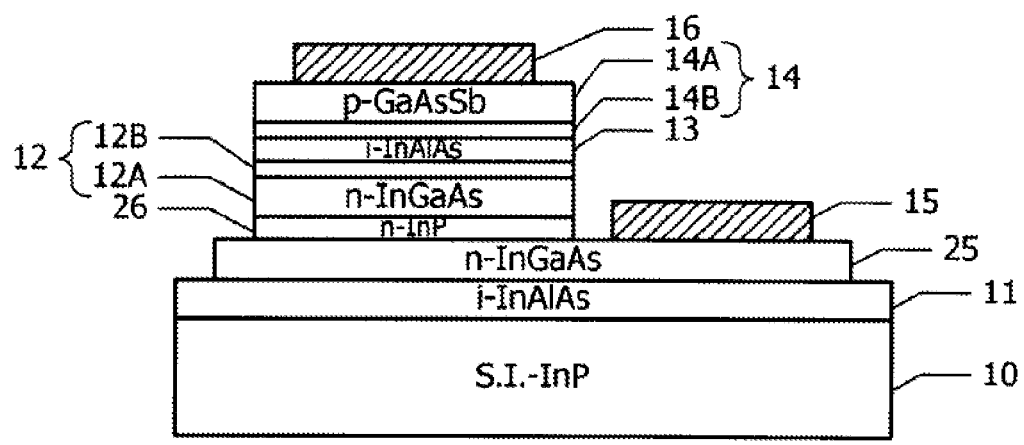
FIG. 16B is a sectional view of the semiconductor device.

FIG. 16B is a sectional view of the semiconductor device according to the sixth embodiment. The description below mainly discusses differences from the semiconductor device according to the second embodiment illustrated in FIG. 7E. In the semiconductor device according to the sixth embodiment, the p-type semiconductor layer 12 illustrated in FIG. 7E is divided into the In-poor composition layer 12A and the In-rich composition layer 12B. Moreover, the p-type semiconductor layer 14 is divided into the Sb-poor composition layer 14A and the Sb-rich composition layer 14B. The In-rich composition layer 12B is interposed between the In-poor composition layer 12A and the barrier layer 13. The Sb-rich composition layer 14B is interposed between the Sb-poor composition layer 14A and the barrier layer 13.

In the semiconductor device according to the sixth embodiment, a potential barrier when a reverse bias is applied becomes lower than the potential barrier of the semiconductor device according to the third embodiment illustrated in FIG. 9. Thus, detection characteristics may be further improved.

The In composition ratio of the In-poor composition layer 12A is preferably about 0.53. The Sb composition ratio of the Sb-poor composition layer 14A is preferably about 0.49.

The In composition ratio of the In-rich composition layer 12B is higher than the In composition ratio of the In-poor composition layer 12A. However, excessively high In composition ratio of the In-rich composition layer 12B makes lattice mismatch with the InP substrate 10 larger, and a thickness of a film that may be formed without reducing strain (critical film thickness) becomes thinner. An effect to lower a potential barrier may not be sufficiently obtained if the In composition layer 12B becomes too thin. Therefore, it is preferable that the In composition ratio of the In-rich composition layer 12B be higher than 0.53 but less than or equal to 0.8. The thickness of the In-rich composition layer 12B is preferably in a range of 5 nm to 20 nm.

Likewise, it is preferable that the Sb composition ratio of the Sb-rich composition layer 14B be 0.49 or more but less than or equal to 0.8. The thickness of the Sb-rich composition layer 14B is preferably in a range of 5 nm to 20 nm.

Figure 17A:
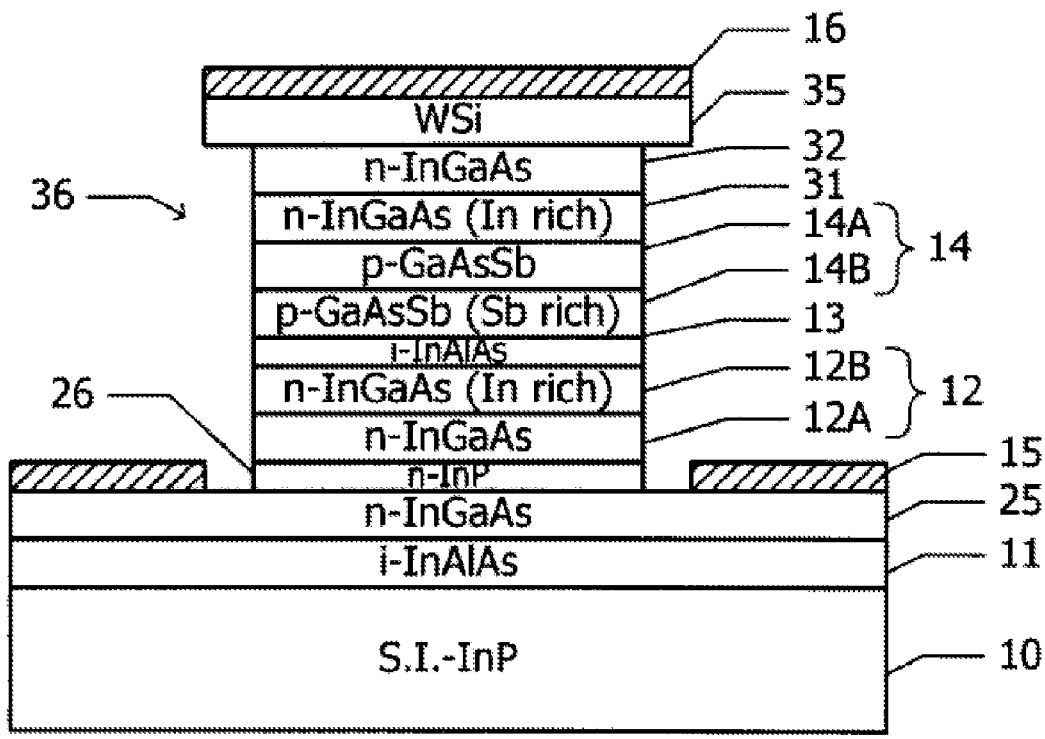
FIGS. 17A and 17B are sectional views of a semiconductor device of an alternative embodiment according to a sixth embodiment.

FIG. 17A is a sectional view of the semiconductor device of an alternative embodiment according to the sixth embodiment. The description below mainly discusses differences from the semiconductor device according to the fourth embodiment illustrated in FIG. 11C. According to the fourth embodiment, the etching stopper layer 38 that is made up of the n-type InP is interposed between the In-poor composition layer 12A and the In-rich composition layer 12B. However, an example in FIG. 17A illustrates that no etching stopper layer is interposed between the In-poor composition layer 12A and the In-rich composition layer 12B. Instead, an n-side ohmic contact layer 25 of an n-type In GaAs is formed over a buffer layer 11, and the n-type InP etching stopper layer 26 is formed over the part of the region of the ohmic contact layer 25. The In-poor composition layer 12A is formed over this etching stopper layer 26. The n-side electrode 15 is in ohmic contact with the n-side ohmic contact layer 25.

The thickness of the n-side ohmic contact layer 25 may be, for example, about 200 nm, and the n-type impurity concentration may be, for example, about $1\times10^{19}$ cm$^{-3}$. The thickness of etching stopper layer 26 may be, for example, about 5 nm, and the n-type impurity concentration may be, for example, about $5\times10^{18}$ cm$^{-3}$. The film thickness, composition, and impurity concentration of each of the n-type semiconductor layer 12, the barrier layer 13, and the p-type semiconductor layer 14 is substantially the same as the configuration illustrated in FIG. 16B.

In the example illustrated in FIG. 17A, the p-type semiconductor layer 14 in FIG. 11C is divided into the Sb-poor composition layer 14A and the Sb-rich composition layer 14B. The energy band diagram of the n-type semiconductor layer 12, the barrier layer 13, and the p-type semiconductor layer 14 are substantially the same as the energy band diagram illustrated in FIG. 16A. Accordingly, using the semiconductor device of the alternative embodiment illustrated in FIG. 17A may obtain substantially the same favorable detection characteristics as using the semiconductor device illustrated in FIG. 16B.

Figure 17B:
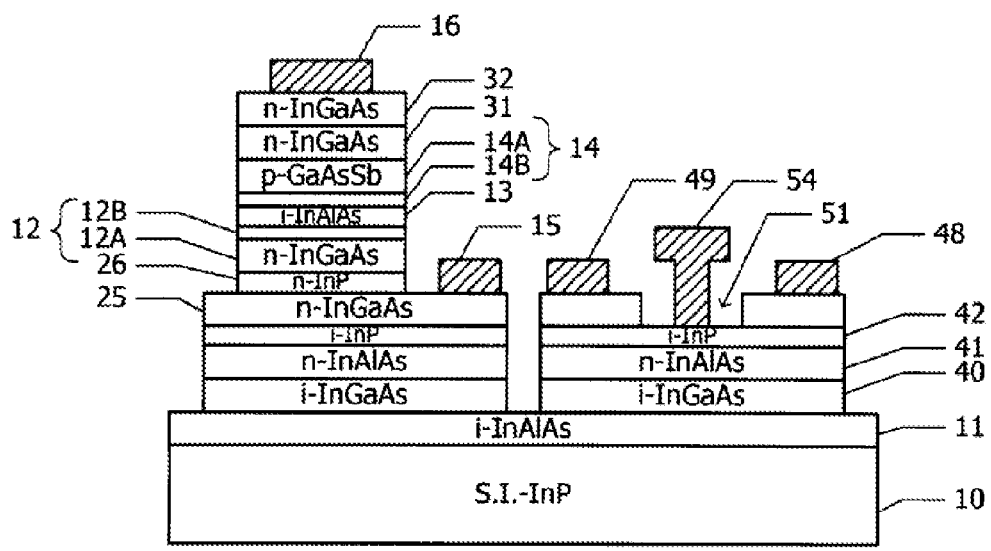

FIG. 17B is a sectional view of a semiconductor device of an alternative embodiment according to the sixth embodiment. The description below mainly discusses differences from the semiconductor device according to the fifth embodiment illustrated in FIG. 14D. In the fifth embodiment, the etching stopper layer 38 that is made up of the n-type InP is interposed between the In-poor composition layer 12A and the In-rich composition layer 12B. However, the example in FIG. 17B illustrates that no etching stopper layer is interposed between the In-poor composition layer 12A and the In-rich composition layer 12B. Instead, an n-side ohmic contact layer 25 of an n-type InGaAs is formed over an etching stopper layer 42, and the n-type InP etching stopper layer 26 is formed over the part of the region of the ohmic contact layer 25. The In-poor composition layer 12A is formed over the etching stopper layer 26. The n-side electrode 15 is in ohmic contact with the upper surface of the n-side ohmic contact layer 25.

The thickness of an intrinsic InGaAs channel layer 40, may be, for example, about 15 nm. The thickness of an n-type InAlAs electron supply layer 41 may be, for example, about 8 nm, and the n-type impurity concentration, may be, for example, about $5\times10^{18}$ cm$^{-3}$. The thickness of the intrinsic InP etching stopper layer 42, may be, for example, about 5 nm. The thickness of the n-type InGaAs ohmic contact layer 25 may be, for example, about 50 nm, and the n-type impurity concentration, may be, for example, about $1\times10^{19}$ cm$^{-3}$. The thickness of the n-type InP etching stopper layer 26 may be, for example, about 5 nm, and the n-type impurity concentration, may be, for example, about $5\times10^{18}$ cm$^{-3}$.

The thickness, composition, and impurity concentration of each of the n-type semiconductor layer 12, the barrier layer 13, and the p-type semiconductor layer 14 is substantially the same as the configuration illustrated in FIG. 16B.

In the example illustrated in FIG. 17B, the p-type semiconductor layer 14 illustrated in FIG. 14D is divided into the Sb-poor composition layer 14A and the Sb-rich composition layer 14B. In the example illustrated in FIG. 17B, an interlayer dielectric film 56 and a wiring 57 etc., are formed as well illustrated in FIG. 14H. The energy band diagram including the n-type semiconductor layer 12, the barrier layer 13, and the p-type semiconductor layer 14 is substantially the same as the energy band diagram illustrated in FIG. 16A. Accordingly, the example in FIG. 17B may obtain favorable detection characteristics as in the detection circuit using the semiconductor device illustrated in FIG. 16B.

Seventh Embodiment

Figure 18A:
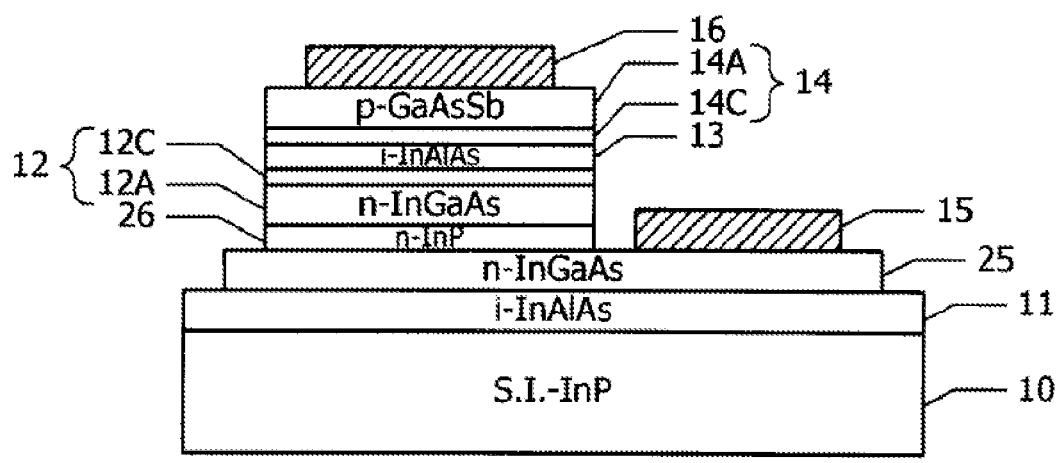
FIG. 18A is a sectional view of a semiconductor device according to a seventh embodiment.

FIG. 18A is a sectional view of a semiconductor device according to a seventh embodiment. The description below may focus on differences from the semiconductor device according to the second embodiment illustrated in FIG. 7E. In the semiconductor device according to the seventh embodiment, the n-type semiconductor layer 12 is divided into an n-type low concentration layer 12A and an n-type high concentration layer 12C. A p-type semiconductor layer 14 is divided into a p-type low concentration layer 14A and a p-type high concentration layer 14C. The n-type high concentration layer 12C is interposed between the n-type low concentration layer 12A and the barrier layer 13, and in contact with the barrier layer 13. The p-type high concentration layer 14C is interposed between the p-type low concentration layer 14A and the barrier layer 13, and in contact with the barrier layer 13.

The n-type impurity concentration of the n-type high concentration layer 12C is higher than the n-type impurity concentration of the n-type low concentration layer 12A. The p-type impurity concentration of the p-type high concentration layer 14C is higher than the p-type impurity concentration of the p-type low concentration layer 14A. The InGaAs composition ratio of the n-type high concentration layer 12C is substantially the same as the InGaAs composition ratio of the n-type low concentration layer 12A. The GaAsSb composition ratio of the p-type high concentration layer 14C is substantially the same as the GaAsSb composition ratio of the p-type low concentration layer 14A. These composition ratios are selected so as to lattice-match with InP.

Figure 18B:
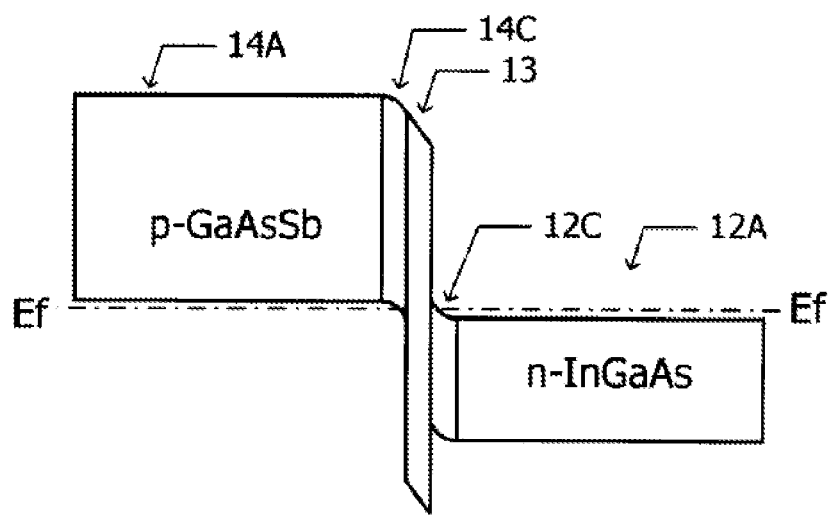
FIG. 18B is an energy band diagram of the semiconductor device.

FIG. 18B is an energy band diagram of the n-type semiconductor layer 12, the barrier layer 13, and the p-type semiconductor layer 14 illustrated in FIG. 18A under an equilibrium state. Hereunder, description will be made in comparison to the energy band illustrated in FIG. 4B in which an n-type high concentration layer 12C and a p-type high concentration layer 14C, the impurity concentration of which are relatively high, are not disposed. Disposing the n-type high concentration layer 12C and the p-type high concentration layer 14C with high impurity concentrations at both sides of the barrier layer 13 makes the bending of the band larger. In other words, the bending region of the band is localized in the vicinity of the barrier layer 13. The barrier layer 13 and the extremely thin region adjacent to the barrier layer 13 make up a depletion layer.

Figure 19A:
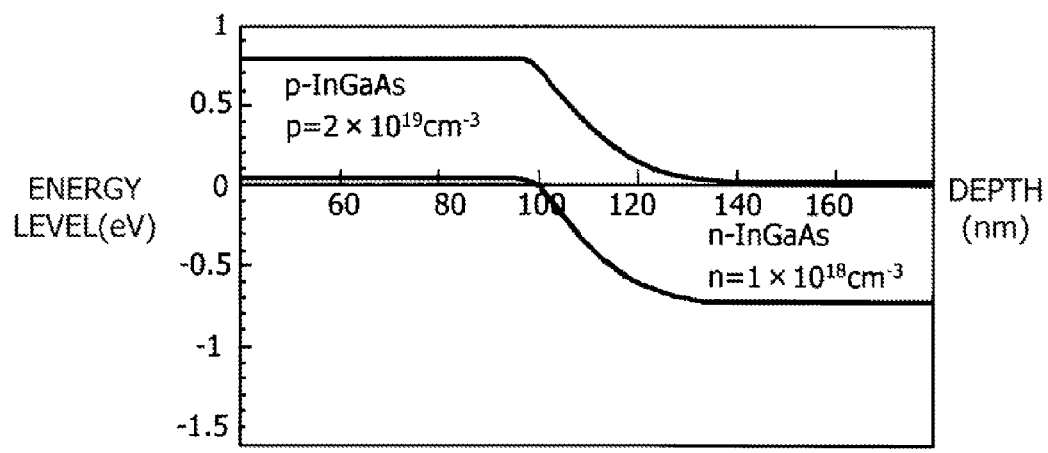
FIGS. 19A to 19C are graphs illustrating simulation results of the energy band diagram when impurity concentrations of the n-type semiconductor layer are changed.
Figure 19B:
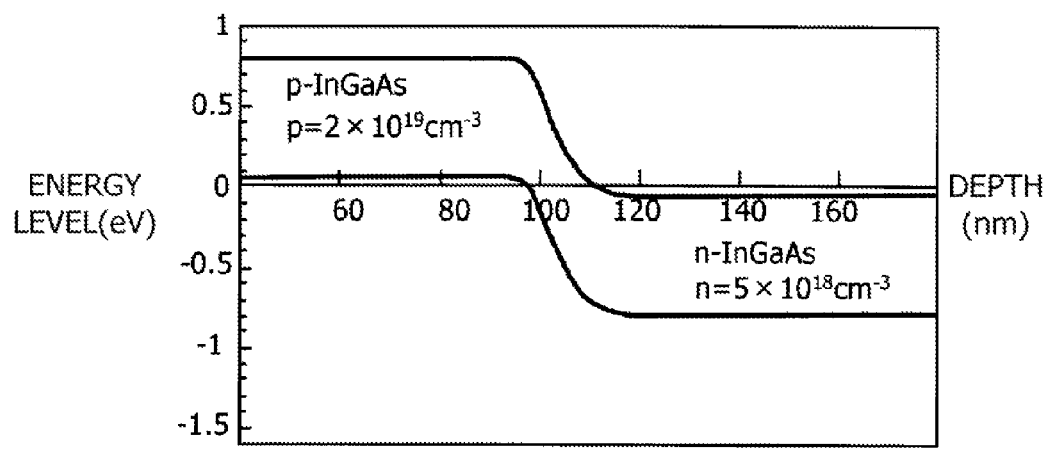
Figure 19C:
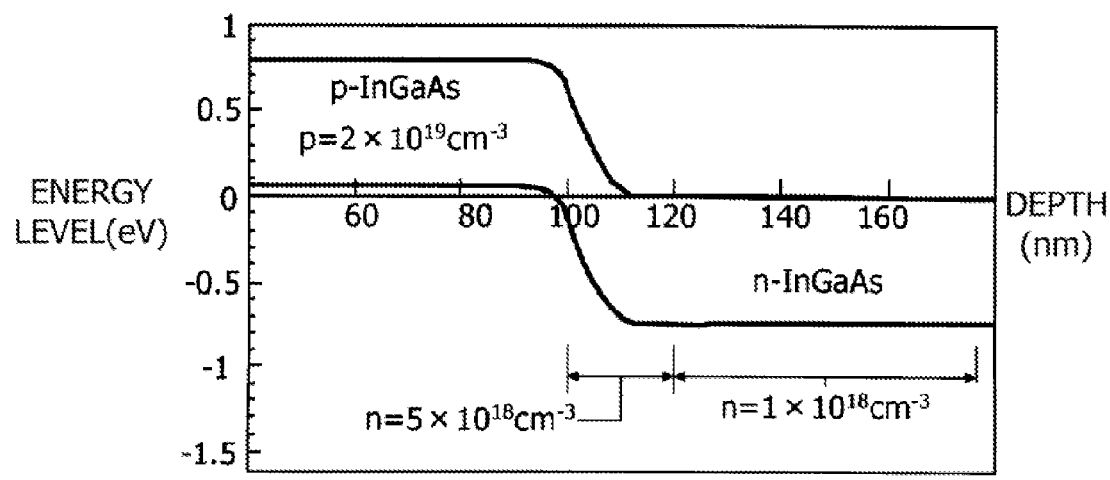

FIGS. 19A to 19C illustrate simulation results of energy band diagram for a p-n junction in which the p-type InGaAs layer and the n-type InGaAs layer are joined. The horizontal axis indicates a position in the depth direction in units of "nm." The vertical axis indicates an energy level of electrons in units of "eV" by assuming a Fermi level as a reference. The In composition ratios of both layers are 0.53. The position of the depth at about 100 nm corresponds to the interface of the p-n junction.

The p-type impurity concentration of the p-type InGaAs layer is about $2 \times 10^{19}$ cm$^{-3}$ in FIGS. 19A to 19C. In the example illustrated in FIG. 19A, the n-type impurity concentration of the n-type InGaAs layer is about $1 \times 10^{18}$ cm$^{-3}$. In the example illustrated in FIG. 19B, the n-type impurity concentration of the n-type InGaAs layer is higher compared to n-type impurity concentration in FIG. 19A, and is about $5 \times 10^{18}$ cm$^{-3}$. In the example illustrated in FIG. 19C, the n-type InGaAs layer is made up of a high concentration layer and a low concentration layer. The high concentration layer is disposed between the p-type InGaAs layer and the low concentration layer, and the thickness is about 20 nm. The n-type impurity concentrations of the high concentration layer and the low concentration layer are about $5 \times 10^{18}$ cm$^{-3}$ and $1 \times 10^{18}$ cm$^{-3}$ respectively.

As illustrated in examples of FIGS. 19B and 19C, increasing the impurity concentration of the n-type InGaAs layer near the interface of the p-n junction makes the bending portion of the energy band larger, and makes the depletion layer serving as a potential barrier thinner. Therefore, a tunnel current when a reverse bias is applied may be increased. The probability of tunneling of the p-n junction illustrated in FIGS. 19A to 19C may be calculated. The tunneling probability for the examples illustrated in FIGS. 19B and 19C are 0.888 and 0.907 respectively while the tunneling probability for the example of FIG. 19A is 0.779.

Comparison of the example illustrated in FIG. 19B and the example illustrated in FIG. 19A reveals that the energy level at the lower end of the conduction band of the n-type InGaAs layer is lower than that of the upper end of the valence band of the p-type InGaAs layer in both of the examples. The differences in energy levels are larger in the example illustrated in FIG. 19B than those illustrated in FIG. 19A. Thus, in the example illustrated in FIG. 19B, when an infinitesimal forward bias is applied to the p-n junction, electrons in the conduction band of the n-type InGaAs layer are easily transported to the valence band of the p-type InGaAs layer by interband tunneling. Moreover, holes in the valence band of the p-type InGaAs layer are easily transported to the conduction band of the n-type InGaAs layer by interband tunneling.

In the example illustrated in FIG. 19C, when an infinitesimal forward bias is applied to the p-n junction, the energy level of electrons in the conduction band of the n-type InGaAs layer is in the band gap of the p-type InGaAs layer. The energy level of the holes in the valence band of the p-type InGaAs layer is in the forbidden band of the n-type InGaAs layer. Thus, almost no current flows by interband tunneling.

As described above, making a region near the p-n junction in the n-type InGaAs layer high concentration may further suppress a current increase when an infinitesimal forward bias is applied compared with making all of the region of the n-type InGaAs layer high concentration.

As described above, the example illustrated in FIG. 19C enables a current to be increased when a reverse bias is applied and a current increase to be suppressed when a forward bias is applied. Therefore, non-linearity of current-voltage characteristics when an infinitesimal voltage is applied may be improved. As a result, detection characteristics when the p-n junction element is employed for the detection circuit may be improved.

A non-linearity coefficient γ is calculated that is proportional to the detection sensitivity of the detection circuit using the semiconductor device with the p-n junction illustrated in FIGS. 19A to 19C. The non-linearity coefficient γ when the semiconductor device with the p-n junction illustrated in FIG. 19A is used is 83V−1. However, the non-linearity coefficient γ decreases to 34V−1 when the semiconductor device with the p-n junction illustrated in FIG. 19B is used. The non-linearity coefficient γ when the semiconductor device with the p-n junction illustrated in FIG. 19C is 83V−1 and this is substantially the same amount as when the semiconductor device with the p-n junction illustrated in FIG. 19A is used.

In FIGS. 19A to 19C, simulations are performed for a configuration in which the barrier layer 13 illustrated in FIGS. 18A and 18B is not disposed. However, the same effect may be achieved even for a configuration in which the barrier layer 13 is disposed. A potential barrier may be made thinner by disposing a p-type high concentration layer 14C to the p-type semiconductor layer 14 side. The p-type high concentration layer 14C may be disposed only to the p-type semiconductor layer 14 side.

Eighth Embodiment

Figure 20A:
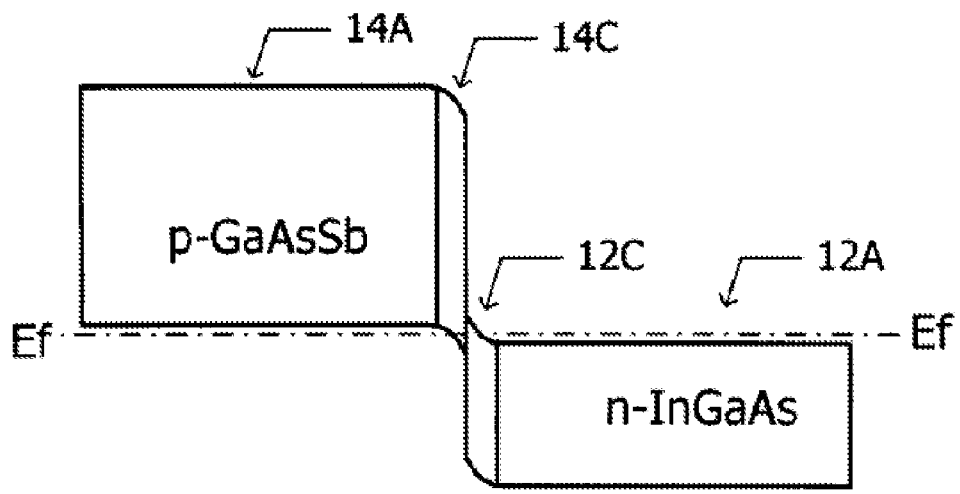
FIG. 20A is an energy band diagram of the semiconductor device according to an eighth embodiment.

FIG. 20A is an energy band diagram near the p-n junction of a semiconductor device according to an eighth embodiment. The semiconductor device according to the eighth embodiment is made up of a configuration in which a barrier layer 13 is removed from the semiconductor device according to the seventh embodiment illustrated in FIGS. 18A and 18B. Hence, the n-type high-concentration layer 12C is directly in contact with the p-type high concentration layer 14C.

A depletion layer generated in an extremely thin region that includes the p-n junction serves as a potential barrier against electrons and holes. Therefore, substantially the same current-voltage characteristics as the semiconductor device according to the seventh embodiment may be obtained.

Figure 20B:
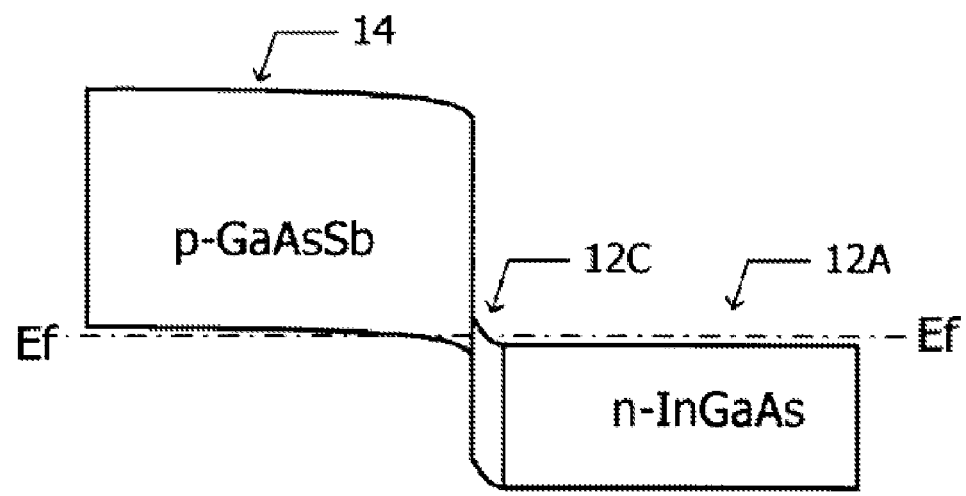
FIGS. 20B and 20C are energy band diagrams of the alternative embodiments according to the eighth embodiment.
Figure 20C:
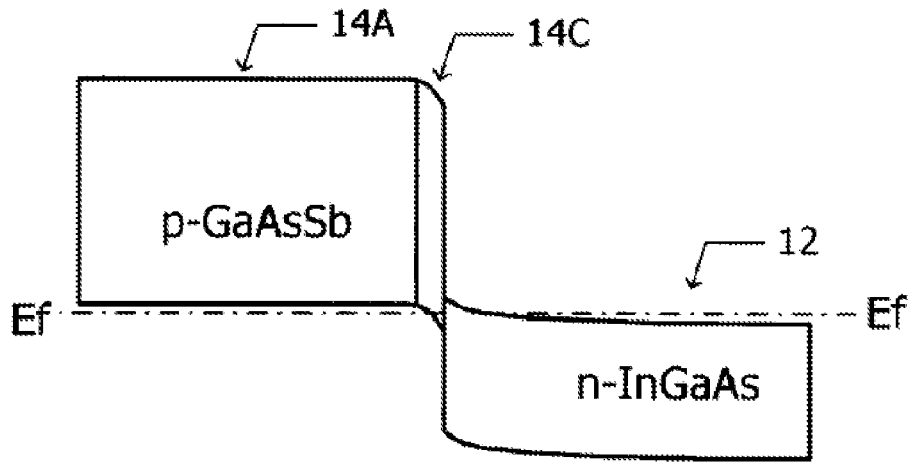

As illustrated in FIG. 20B, a n-type high-concentration layer 12C may be disposed only on the n-type semiconductor layer 12 side, or as illustrated in FIG. 20C, a p-type high-concentration layer 14C may be disposed only on the p-type semiconductor layer 14 side.

Ninth Embodiment

Figure 21A:
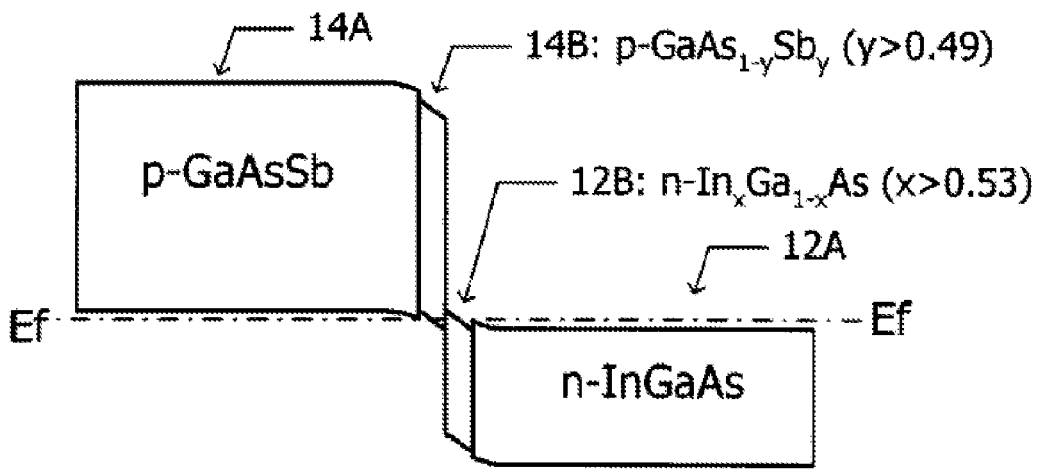
FIG. 21A is an energy band diagram according to a ninth embodiment.

FIG. 21A is an energy band diagram near the p-n junction of a semiconductor device according to a ninth embodiment. The semiconductor device according to the ninth embodiment has a configuration in which a barrier layer 13 is removed from the semiconductor device according to the sixth embodiment illustrated in FIGS. 16A and 16B. As a result, an n-type In-rich composition layer 12B is directly in contact with a p-type Sb-rich composition layer 14B.

A depletion layer generated in an extremely thin region that includes the p-n junction interface serves as a potential barrier against electrons and holes. Therefore, substantially the same current-voltage characteristics as the semiconductor device according to the sixth embodiment may be obtained.

Figure 21B:
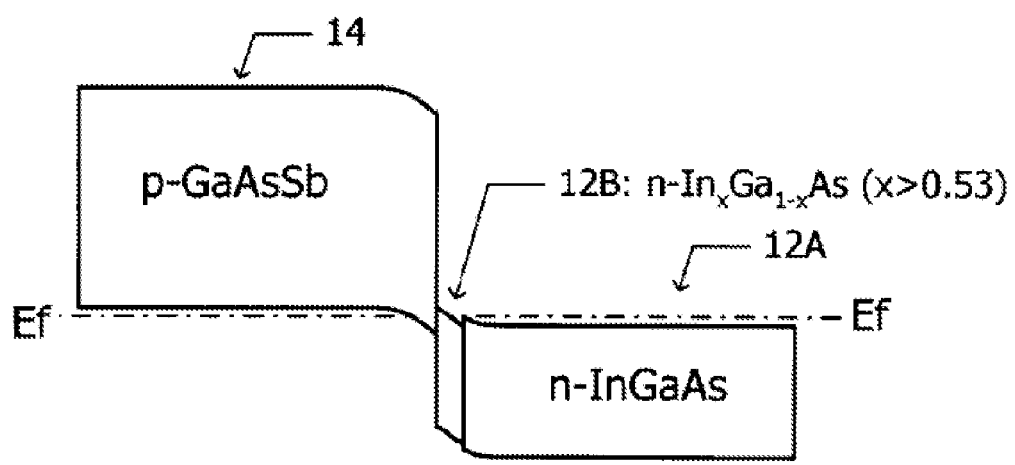
FIGS. 21B and 21C are energy band diagrams of the semiconductor device of the alternative embodiments according to the ninth embodiment.
Figure 21C:
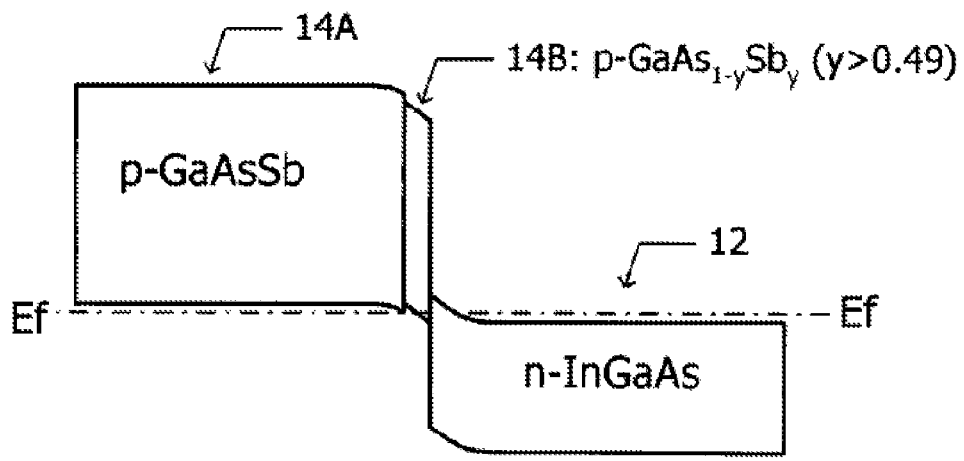

As illustrated in FIG. 21B, an In-rich composition layer 12B may be disposed only on the n-type semiconductor layer 12 side, or as illustrated in FIG. 21C, a Sb-rich composition layer 14B may be disposed only on the p-type semiconductor layer 14 side.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alternations could be made hereto without departing from the spirit and scope of the invention.

What is claimed is:

1. A semiconductor device comprising:
   a p-type semiconductor layer and an n-type semiconductor layer that are coupled by sandwiching a depletion layer with a thickness that allows transmission of a plurality of electrons by direct tunneling, wherein
   a forbidden band of the n-type semiconductor layer and a forbidden band of the p-type semiconductor layer partially overlap under a state in which a flat band voltage that makes energy bands of the n-type semiconductor layer and the p-type semiconductor layer flat is applied between the n-type semiconductor layer and the p-type semiconductor layer; and
   an energy level of a plurality of electrons at an upper end of a valence band of the p-type semiconductor layer is equal to or higher than an energy level of a plurality of electrons at a lower end of a conduction band of the n-type semiconductor layer in a region that is further away from the depletion layer than a bending portion of an energy band which is contiguous with the depletion layer under an equilibrium state without any voltage being applied.

2. The semiconductor device according to claim 1, further comprising:
   a barrier layer with a forbidden band width wider than forbidden band widths of the p-type semiconductor layer and the n-type semiconductor layer, and that is disposed between the p-type semiconductor layer and the n-type semiconductor layer, wherein the depletion layer includes the barrier layer.

3. The semiconductor device according to claim 1, wherein the p-type semiconductor layer is in contact with the n-type semiconductor layer, and the depletion layer is formed in a region which includes a junction interface of the p-type semiconductor layer and the n-type semiconductor layer.

4. The semiconductor device according to claim 1, wherein
   applying a voltage of a polarity that makes a potential of the p-type semiconductor layer lower than a potential of the n-type semiconductor layer causes transportation of the plurality of electrons in the valence band of the p-type semiconductor layer to the conduction band of the n-type semiconductor layer by direct tunneling of the potential barrier; and
   applying a voltage of a polarity that makes a potential of the p-type semiconductor layer higher than a potential of the n-type semiconductor layer inhibits transportation of an electron by interband tunneling.

5. The semiconductor device according to claim 1, wherein
   the n-type semiconductor layer and the p-type semiconductor layer are made up of III-V compound semiconductors;
   the n-type semiconductor layer includes In and As; and
   the p-type semiconductor layer includes As and Sb.

6. The semiconductor device according to claim 1, wherein
   the n-type semiconductor layer includes an n-type high concentration layer with a relatively high n-type impurity concentration, and an n-type low concentration layer with a relatively low n-type impurity concentration; and
   the n-type high concentration layer is disposed closer to the p-type semiconductor layer side than the n-type low concentration layer.

7. The semiconductor device according to claim 1, wherein
   the p-type semiconductor layer includes a p-type high concentration layer with a relatively high p-type impurity concentration and a p-type low concentration layer with a relatively low impurity concentration; and
   the p-type high concentration layer is disposed closer to the n-type semiconductor layer side than the p-type low concentration layer.

8. The semiconductor device according to claim 5, wherein
   the n-type semiconductor layer includes an In-rich composition layer with a relatively high In composition ratio, and a In-poor composition layer with a relatively low In composition ratio; and
   the In-rich composition layer is disposed closer to the p-type semiconductor layer side than the In-poor composition layer.

9. The semiconductor device according to claim 5, wherein
   the p-type semiconductor layer includes a Sb-rich composition layer with a relatively high Sb composition ratio and a Sb-poor composition layer with a relatively low Sb composition ratio; and
   the Sb-rich composition layer is disposed closer to the n-type semiconductor layer side than the Sb-poor composition layer.

10. The semiconductor device according to claim 1, wherein
    the n-type semiconductor layer is formed of InGaAs; and
    the p-type semiconductor layer is formed of GaAsSb.

11. The semiconductor device according to claim 10 further comprising:
    an InP substrate that supports the n-type semiconductor layer, the barrier layer, and the p-type semiconductor layer.

12. The semiconductor device according to claim 11 further comprising:
- an n-side ohmic contact layer that is made up of an n-type semiconductor with substantially the same composition as the n-type semiconductor layer and disposed between the InP substrate and the n-type semiconductor layer;
- an etching stopper layer that is made up of an n-type semiconductor that includes In and P and is disposed between the n-side ohmic contact layer and the n-type semiconductor layer;
- an n-side electrode that is ohmically coupled to the n-side ohmic contact layer;
- a p-side electrode that is ohmically coupled to the p-side semiconductor layer, wherein
- the n-side ohmic contact layer includes an extended region that, in a planar view, is larger than a laminated structure from the etching stopper layer to the p-type semiconductor layer; and
- the n-side electrode is formed over the extended region.

13. The semiconductor device according to claim 12 further comprising:
- a p-side ohmic contact layer that is made up of an n-type semiconductor with substantially the same composition as the n-type semiconductor layer and is disposed over a surface of the p-type semiconductor layer that is different from the surface where the n-type semiconductor layer is formed; and
- a p-side ohmic coupling layer that includes In, Ga, and As and is formed with an n-type semiconductor with higher In composition than the p-side ohmic contact layer and is disposed between the p-side ohmic contact layer and the p-type semiconductor layer, wherein
- the p-side electrode is coupled to the p-side ohmic contact layer.

14. The semiconductor device according to claim 12 further comprising:
- an amplifier element that is formed over the InP substrate includes an input terminal and an output terminal, amplifies an electric signal input into the input terminal, and outputs the electric signal to the output terminal; and
- a wiring that is formed over the InP substrate and couples the n-side electrode and the output terminal.

15. A receiver comprising:
a detector; and
an amplifier that is coupled to the detector, wherein
the detector includes:
a p-type semiconductor layer and an n-type semiconductor layer that are joined by sandwiching a depletion layer with a thickness that allows transmission of a plurality of electrons and holes by direct tunneling, wherein
a forbidden band of the n-type semiconductor layer and a forbidden band of the p-type semiconductor layer partially overlap under a state in which a flat band voltage that makes energy bands of the n-type semiconductor layer and the p-type semiconductor layer flat is applied between the n-type semiconductor layer and the p-type semiconductor layer; and
an energy level of a plurality of electrons at an upper end of a valence band of the p-type semiconductor layer is equal to or higher than an energy level of a plurality of electrons at a lower end of a conduction band of the n-type semiconductor layer in a region that is further away from the depletion layer than a bending portion of the energy band which is contiguous with the depletion layer, under an equilibrium state without any voltage being applied.

* * * * *